(12) United States Patent
Jannard

(10) Patent No.: US 7,988,283 B2
(45) Date of Patent: Aug. 2, 2011

(54) EYEGLASSES WITH DETACHABLE ADJUSTABLE ELECTRONICS MODULE

(75) Inventor: James H. Jannard, Eastsound, WA (US)

(73) Assignee: Oakley, Inc., Foothill Ranch, CA (US)

( * ) Notice: Subject to any disclaimer, the term of this patent is extended or adjusted under 35 U.S.C. 154(b) by 0 days.

(21) Appl. No.: 12/730,106

(22) Filed: Mar. 23, 2010

(65) Prior Publication Data

US 2010/0238396 A1 Sep. 23, 2010

Related U.S. Application Data

(63) Continuation of application No. 12/331,327, filed on Dec. 9, 2008, now Pat. No. 7,682,018, which is a continuation of application No. 11/352,938, filed on Feb. 13, 2006, now Pat. No. 7,461,936, which is a continuation-in-part of application No. 10/993,217, filed on Nov. 19, 2004, now Pat. No. 7,278,734, which is a continuation-in-part of application No. 10/628,831, filed on Jul. 28, 2003, now Pat. No. 7,150,526, and a continuation-in-part of application No. 10/004,543, filed on Dec. 4, 2001, now Pat. No. 6,966,647, which is a continuation of application No. 09/585,593, filed on Jun. 2, 2000, now Pat. No. 6,325,507, said application No. 11/352,938 is a continuation-in-part of application No. 11/022,367, filed on Dec. 22, 2004.

(60) Provisional application No. 60/399,317, filed on Jul. 26, 2002, provisional application No. 60/460,154, filed on Apr. 3, 2003, provisional application No. 60/652,272, filed on Feb. 11, 2005, provisional application No. 60/652,937, filed on Feb. 14, 2005, provisional application No. 60/729,645, filed on Oct. 24, 2005.

(51) Int. Cl.
G02C 1/00 (2006.01)
(52) U.S. Cl. ............................ 351/158; 351/41; 381/381
(58) Field of Classification Search .................... 351/41, 351/111, 158; 381/351, 381
See application file for complete search history.

(56) References Cited

U.S. PATENT DOCUMENTS 2,856,466 A 10/1958 Gustafson et al.
(Continued)

FOREIGN PATENT DOCUMENTS

CN 1687817 10/2005
(Continued)

OTHER PUBLICATIONS

Bluetooth Specification Version 1.1, Feb. 22, 2001, pp. 1-452.
Franklin, Curt. How Bluetooth Works from "www.howstuffworks.com", Web site visited on Jun. 11, 2002.
Hands-Free Profile (HFP), Oct. 22, 2001, 71 pgs.
Motorola Bluetooth Wireless Headset User Guide, 2001, 27 pgs.

(Continued)

Primary Examiner — Huy K Mai
(74) Attorney, Agent, or Firm — Knobbe, Martens, Olson & Bear, LLP

(57) ABSTRACT

A detachable adjustable electronics module may be removably or permanently connected to eyewear. The module may include electronics for processing audio and/or video signals. The module may be provided with an adjustable arm, for adjustably carrying a speaker. The module and/or the speaker may be adjusted relative to the wearer in any of the anterior-posterior direction, the inferior-superior direction and laterally. Rotation adjustments may also be accomplished. Eyewear may be provided with only a single module, on a single side, or with two modules, one on each side, such as to provide stereo audio or dual mono sound.

20 Claims, 41 Drawing Sheets

U.S. PATENT DOCUMENTS

| | | | |
|---|---|---|---|
| 3,588,384 | A | 6/1971 | Negley |
| 3,665,122 | A | 5/1972 | Weiss |
| 3,809,829 | A | 5/1974 | Vignini et al. |
| 3,883,701 | A | 5/1975 | Delorenzo |
| 4,683,587 | A | 7/1987 | Silverman |
| 4,712,244 | A | 12/1987 | Zwicker et al. |
| 4,806,011 | A | 2/1989 | Bettinger |
| 4,856,086 | A | 8/1989 | McCullough |
| 4,882,769 | A | 11/1989 | Gallimore |
| 4,902,120 | A | 2/1990 | Weyer |
| 4,904,078 | A | 2/1990 | Gorike |
| 5,020,150 | A | 5/1991 | Shannon |
| 5,159,639 | A | 10/1992 | Shannon et al. |
| 5,327,178 | A | 7/1994 | McManigal |
| 5,335,285 | A * | 8/1994 | Gluz ............................. 381/381 |
| 5,353,378 | A | 10/1994 | Hoffman |
| 5,367,345 | A | 11/1994 | Da Silva |
| 5,404,385 | A * | 4/1995 | Ben-Haim ................... 377/24.2 |
| RE35,051 | E | 10/1995 | Moore |
| 5,533,130 | A | 7/1996 | Staton |
| 5,579,400 | A | 11/1996 | Ballein |
| 5,606,743 | A * | 2/1997 | Vogt et al. ..................... 455/347 |
| 5,608,808 | A | 3/1997 | Da Silva |
| 5,634,201 | A | 5/1997 | Mooring |
| 5,671,037 | A | 9/1997 | Ogasawara et al. |
| 5,694,475 | A | 12/1997 | Boyden |
| 5,715,323 | A | 2/1998 | Walker |
| 5,717,479 | A | 2/1998 | Rickards |
| 5,737,436 | A | 4/1998 | Boyden |
| 5,892,564 | A | 4/1999 | Rahn |
| 5,953,434 | A | 9/1999 | Boyden |
| 5,978,689 | A | 11/1999 | Tuoriniemi et al. |
| 5,988,812 | A | 11/1999 | Wingate |
| 6,010,216 | A | 1/2000 | Jesiek |
| 6,012,812 | A * | 1/2000 | Rickards ....................... 351/158 |
| 6,057,966 | A | 5/2000 | Carroll et al. |
| 6,091,546 | A * | 7/2000 | Spitzer ......................... 359/618 |
| 6,091,832 | A | 7/2000 | Shurman et al. |
| 6,176,576 | B1 | 1/2001 | Green et al. |
| 6,218,958 | B1 | 4/2001 | Eichstaedt et al. |
| 6,233,345 | B1 | 5/2001 | Urwyler |
| 6,252,970 | B1 | 6/2001 | Poon et al. |
| 6,272,359 | B1 | 8/2001 | Kivela et al. |
| 6,301,050 | B1 | 10/2001 | DeLeon |
| 6,301,367 | B1 | 10/2001 | Boyden et al. |
| 6,325,507 | B1 | 12/2001 | Jannard et al. |
| 6,349,001 | B1 | 2/2002 | Spitzer |
| 6,353,503 | B1 | 3/2002 | Spitzer et al. |
| 6,392,798 | B1 | 5/2002 | Newkirk |
| 6,421,031 | B1 | 7/2002 | Ronzani et al. |
| 6,456,721 | B1 | 9/2002 | Fukuda |
| 6,474,816 | B2 | 11/2002 | Butler et al. |
| 6,490,362 | B1 | 12/2002 | Clegg et al. |
| 6,549,122 | B2 | 4/2003 | Depta |
| 6,582,075 | B1 | 6/2003 | Swab et al. |
| 6,618,099 | B1 | 9/2003 | Spitzer |
| 6,629,076 | B1 | 9/2003 | Haken |
| 6,650,894 | B1 | 11/2003 | Berstis et al. |
| 6,690,807 | B1 | 2/2004 | Meyer |
| 6,729,726 | B2 | 5/2004 | Miller et al. |
| 6,769,767 | B2 | 8/2004 | Swab et al. |
| 6,966,647 | B2 | 11/2005 | Jannard et al. |
| 7,004,582 | B2 | 2/2006 | Jannard et al. |
| 7,013,009 | B2 | 3/2006 | Warren |
| 7,097,300 | B2 * | 8/2006 | Himmele ...................... 351/158 |
| 7,124,425 | B1 * | 10/2006 | Anderson et al. ................ 725/68 |
| 7,147,324 | B2 | 12/2006 | Jannard |
| 7,150,526 | B2 | 12/2006 | Jannard |
| 7,158,096 | B1 | 1/2007 | Spitzer |
| 7,213,917 | B2 | 5/2007 | Jannard et al. |
| 7,216,973 | B2 | 5/2007 | Jannard |
| 7,219,994 | B2 | 5/2007 | Jannard et al. |
| 7,231,038 | B2 | 6/2007 | Warren |
| 7,264,350 | B2 | 9/2007 | Jannard et al. |
| 7,278,734 | B2 | 10/2007 | Jannard et al. |
| 7,321,785 | B2 | 1/2008 | Harris |
| 7,445,332 | B2 | 11/2008 | Jannard et al. |
| 7,452,073 | B2 | 11/2008 | Jannard et al. |
| 7,461,936 | B2 * | 12/2008 | Jannard ........................ 351/158 |
| 7,494,216 | B2 | 2/2009 | Jannard et al. |
| 7,512,414 | B2 | 3/2009 | Jannard et al. |
| 7,647,400 | B2 | 1/2010 | Abbott et al. |
| 7,682,018 | B2 * | 3/2010 | Jannard ........................ 351/158 |
| 7,744,213 | B2 | 6/2010 | Jannard et al. |
| 2001/0009410 | A1 | 7/2001 | Fujita |
| 2002/0039063 | A1 | 4/2002 | Ritter |
| 2002/0098877 | A1 | 7/2002 | Glezerman |
| 2002/0118825 | A1 | 8/2002 | Mitra |
| 2002/0159023 | A1 | 10/2002 | Swab |
| 2002/0176330 | A1 | 11/2002 | Ramonowski et al. |
| 2002/0186180 | A1 | 12/2002 | Duda |
| 2002/0497961 | | 12/2002 | Warren |
| 2003/0003969 | A1 | 1/2003 | Tong et al. |
| 2003/0022690 | A1 | 1/2003 | Beyda et al. |
| 2003/0036360 | A1 | 2/2003 | Russell |
| 2003/0067585 | A1 | 4/2003 | Miller et al. |
| 2003/0068057 | A1 | 4/2003 | Miller et al. |
| 2003/0073460 | A1 | 4/2003 | Van Pelt et al. |
| 2004/0000733 | A1 | 1/2004 | Swab et al. |
| 2004/0015403 | A1 | 1/2004 | Moskowitz et al. |
| 2004/0044427 | A1 | 3/2004 | Neuhaus |
| 2004/0048569 | A1 | 3/2004 | Kawamura |
| 2004/0132509 | A1 | 7/2004 | Glezerman |
| 2004/0156012 | A1 | 8/2004 | Jannard et al. |
| 2004/0157649 | A1 | 8/2004 | Jannard et al. |
| 2004/0160572 | A1 | 8/2004 | Jannard et al. |
| 2004/0160573 | A1 | 8/2004 | Jannard et al. |
| 2005/0046789 | A1 | 3/2005 | Jannard et al. |
| 2005/0046790 | A1 | 3/2005 | Jannard et al. |
| 2005/0128431 | A1 | 6/2005 | Jannard et al. |
| 2005/0159182 | A1 | 7/2005 | Lai |
| 2005/0185815 | A1 | 8/2005 | Rickards |
| 2005/0201585 | A1 | 9/2005 | Jannard et al. |
| 2006/0072067 | A1 | 4/2006 | Jannard |
| 2006/0132382 | A1 | 6/2006 | Jannard |
| 2006/0146277 | A1 | 7/2006 | Jannard |
| 2006/0183427 | A1 | 8/2006 | Warren |
| 2006/0197907 | A1 | 9/2006 | Jannard |
| 2006/0203183 | A1 | 9/2006 | Jannard |
| 2006/0203184 | A1 | 9/2006 | Jannard |
| 2007/0008484 | A1 | 1/2007 | Jannard |
| 2007/0037520 | A1 | 2/2007 | Warren |
| 2007/0046887 | A1 | 3/2007 | Howell et al. |
| 2007/0201000 | A1 * | 8/2007 | Jackson et al. ................. 351/158 |
| 2008/0089545 | A1 | 4/2008 | Jannard et al. |
| 2010/0238396 | A1 | 9/2010 | Jannard |
| 2010/0265455 | A1 | 10/2010 | Jannard et al. |
| 2010/0309427 | A1 | 12/2010 | Warren |

FOREIGN PATENT DOCUMENTS

| | | |
|---|---|---|
| CN | 2760600 Y | 2/2006 |
| DE | 202004004378 | 7/2004 |
| EP | 0840465 | 6/1998 |
| FR | 2642856 | 8/1990 |
| IT | 00235504 | 4/2000 |
| JP | 42-022998 | 11/1942 |
| JP | 08-036143 | 2/1996 |
| JP | 10-513021 | 12/1998 |
| JP | 11-353444 | 12/1999 |
| JP | 2001-522063 | 11/2001 |
| JP | 2002-085444 | 3/2002 |
| WO | WO 96/23373 | 8/1996 |
| WO | WO 97/33270 | 9/1997 |
| WO | WO 99/50706 | 10/1999 |
| WO | WO 00/65803 | 11/2000 |
| WO | WO 00/79329 | 12/2000 |
| WO | WO 00/79333 | 12/2000 |
| WO | WO 01/06298 | 1/2001 |

OTHER PUBLICATIONS

Motorola Consumer Catalog for Phone Accessories from "www.commerce.motorola.com", web site visited on Jun. 13, 2002.

Special Product Review "ID Magazine", Aug. 2002, p. 179.

* cited by examiner

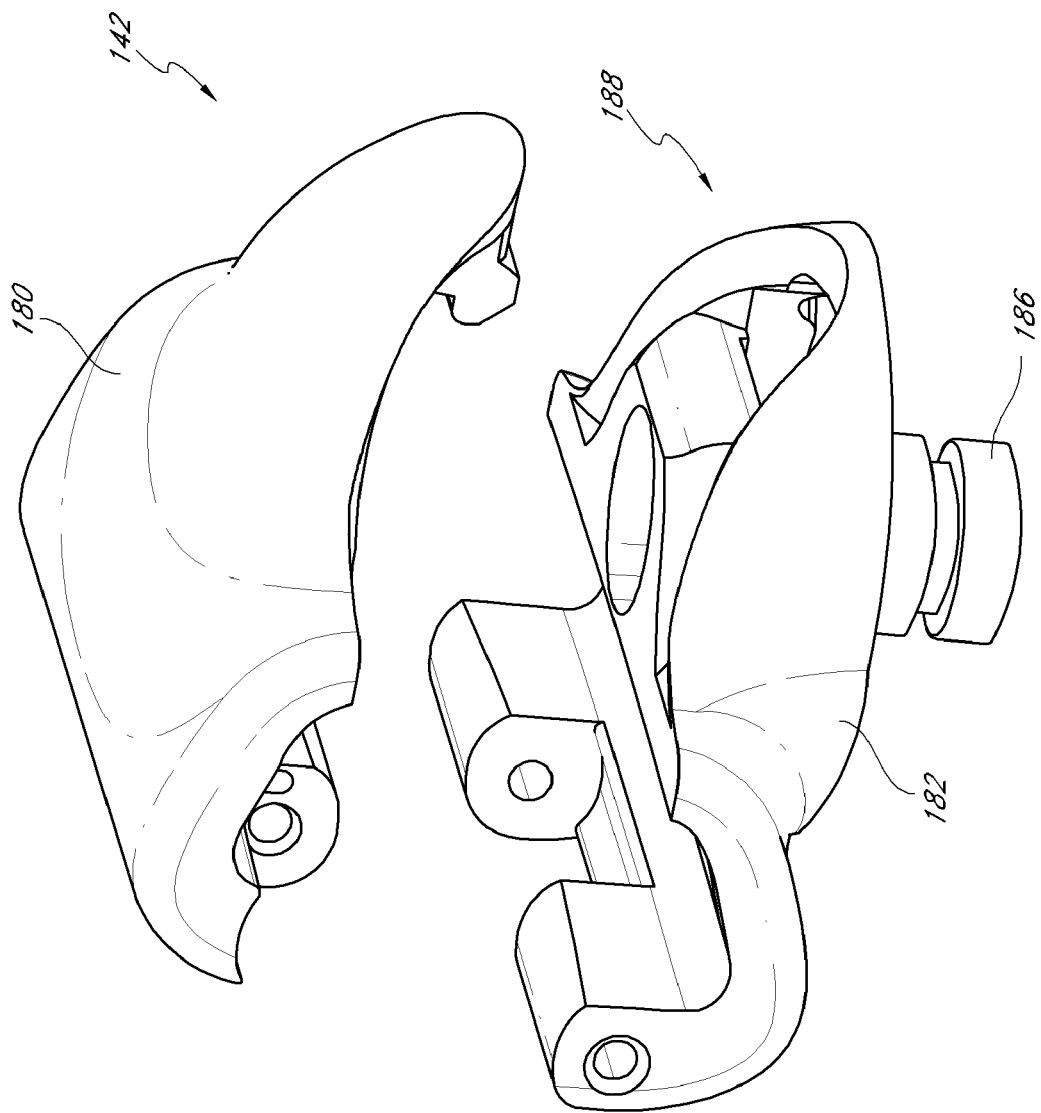
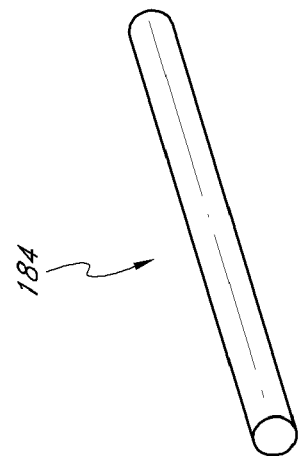
FIG. 13

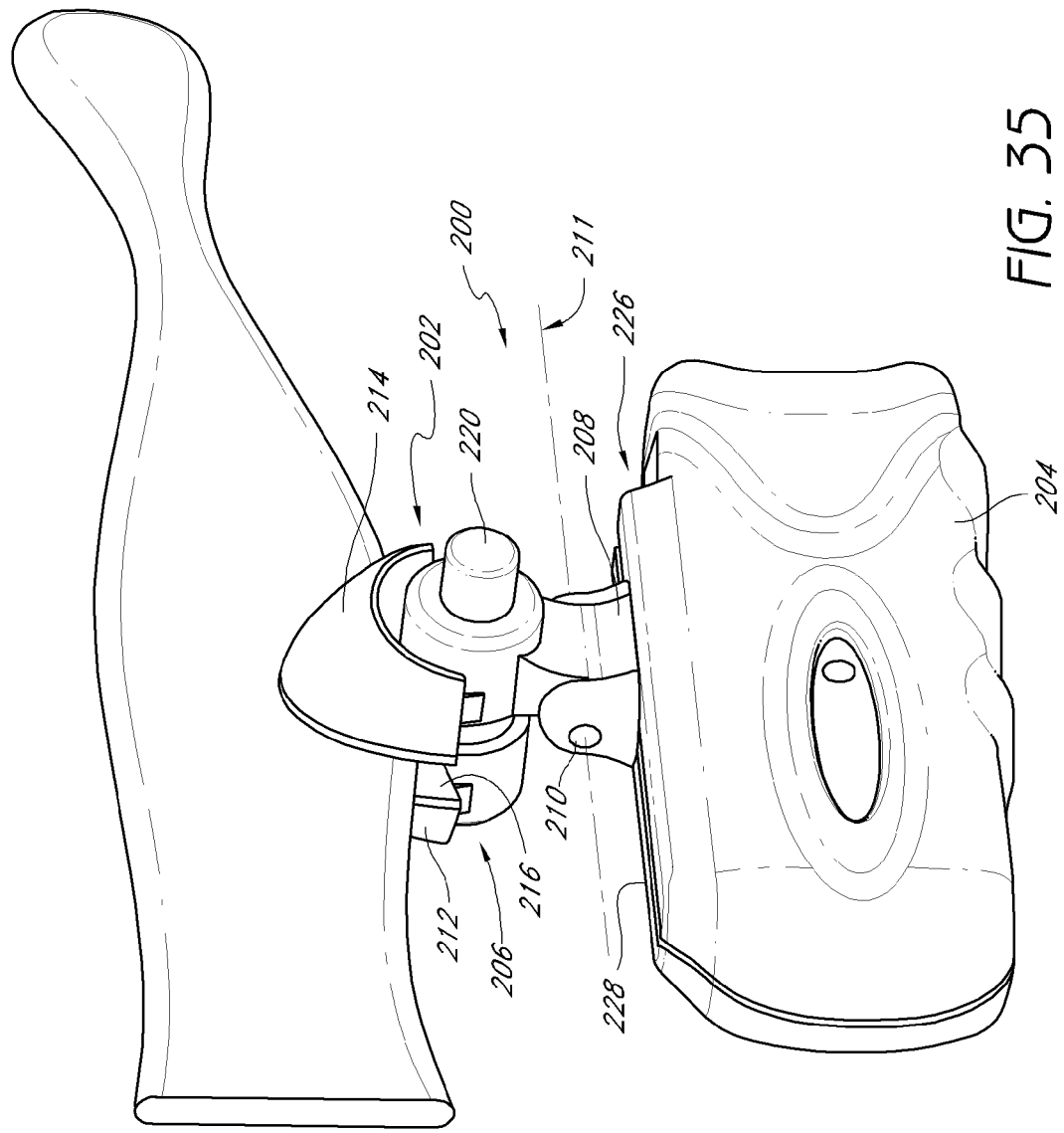

EYEGLASSES WITH DETACHABLE ADJUSTABLE ELECTRONICS MODULE

RELATED APPLICATIONS

This application is a continuation of U.S. application Ser. No. 12/331,327, filed Dec. 9, 2008, now U.S. Pat. No. 7,682,018, which is a continuation of U.S. application Ser. No. 11/352,938, filed Feb. 13, 2006, now U.S. Pat. No. 7,461,936, which is a continuation-in-part of U.S. application Ser. No. 10/993,217, filed Nov. 19, 2004, now U.S. Pat. No. 7,278,734, which is a continuation-in-part of U.S. application Ser. No. 10/628,831, filed Jul. 28, 2003, now U.S. Pat. No. 7,150,526, which claims priority from U.S. Provisional No. 60/399,317, filed Jul. 26, 2002 and U.S. Provisional No. 60/460,154, filed Apr. 3, 2003, and which is a continuation-in-part of U.S. application Ser. No. 10/004,543, filed Dec. 4, 2001, now U.S. Pat. No. 6,966,647, which is a continuation of U.S. application Ser. No. 09/585,593, filed Jun. 2, 2000, now U.S. Pat. No. 6,325,507; U.S. application Ser. No. 11/352,938, filed Feb. 13, 2006, now U.S. Pat. No. 7,461,936 is also a continuation-in-part of U.S. application Ser. No. 11/022,367, filed Dec. 22, 2004; and also claims priority from U.S. Provisional No. 60/652,272, filed Feb. 11, 2005, U.S. Provisional No. 60/652,937, filed Feb. 14, 2005, and U.S. Provisional No. 60/729,645, filed Oct. 24, 2005. All of the foregoing are expressly incorporated by reference herein.

BACKGROUND OF THE INVENTION

1. Field of the Invention

The present invention is directed to wearable audio devices, and in particular, devices that humans can wear on their heads and which include electronics such as, for example, speakers, microphones, processors, transmitters, receivers, and/or interface electronics for interacting with a wireless network and/or providing content to a user.

2. Description of the Related Art

There are numerous situations in which it is convenient and preferable to mount audio input and output devices so that they can be worn on the head of a user. Such devices can be used for portable entertainment, personal communications, and the like. For example, these devices could be used in conjunction with cellular telephones, cordless telephones, radios, tape players, MP3 players, portable video systems, hand-held computers and laptop computers.

The audio output for many of these systems is typically directed to the wearer through the use of transducers physically positioned in or covering the ear, such as earphones and headphones. Earphones and headphones, however, are often uncomfortable to use for long periods of time.

In the portable audio playback and cell phone industries, certain devices for remote audio listening and/or use of a cell phone have become more popular. Certain companies have begun to widely distribute portable audio playback devices, such as MP3 players, and headsets for cell phones that allow a user to listen to audio with the use of headphones or ear plugs. For example, a user can wear a headset having speakers connected by a flexible cable to an MP3 player, which can be worn on the belt. Additionally, certain companies have begun to distribute wireless speaker and microphone modules, such as Bluetooth headsets, that are worn over the user's ear and allow wireless communication between the user and his cell phone.

However, with such headsets, whenever a user wants to wear glasses or sunglasses, they must adjust or remove the headset from their ears. Further, it is often quite uncomfortable to wear both a headset and a pair of sunglasses at the same time. Such discomfort, when applied for a long period of time, can cause muscular pain and/or headaches. In addition, the flexible cable extending from the MP3 player to the headphones and the instability of simultaneously wearing eyewear and a headset can limit mobility of the wearer; particularly those participating in sporting activities.

Despite the variety of devices available in the prior art, there remains a need for improved interface electronics and electronics modules, for providing content to a wearer.

SUMMARY OF THE INVENTION

There is provided in accordance with one aspect of the present invention, a dual speaker eyewear system. The system comprises an eyeglass, having a right earstem and a left earstem. A first speaker is supported by the right earstem, and a second speaker is supported by the left earstem. An electronics module is supported by the eyeglass and in electrical communication with each of the first and second speakers.

The electronics module may be releasably connected to one of the right and left earstems. The electronic module may include an MP3 format memory, a radio frequency receiver, a radio frequency transmitter, a cellular telephone, or other electronic device.

The right speaker may be adjustable relative to the right earstem, to align the speaker with the wearer's ear.

In accordance with another aspect of the present invention, there is provided an electronics module for mounted to eyewear. The module comprises a housing, and a clamp moveable mounted to the housing. A speaker is moveably mounted to the housing, and electronics are contained within the housing. The clamp and the speaker are moveable in a manner that permits conversion of the module between a first configuration and a second configuration, wherein the second configuration is a mirror image of the first configuration.

Further features and advantages of the present invention will become apparent to those of skill in the art in view of the detailed description of preferred embodiments which follows, when considered together with the attached drawings and claims.

BRIEF DESCRIPTION OF THE DRAWINGS

FIG. 13 is an exploded view of the coupler of the detachable module of FIG. 5;

FIG. 35 is a perspective view of the detachable module of FIG. 30 attached to a support;

DETAILED DESCRIPTION OF THE PREFERRED EMBODIMENT

Figure 1:
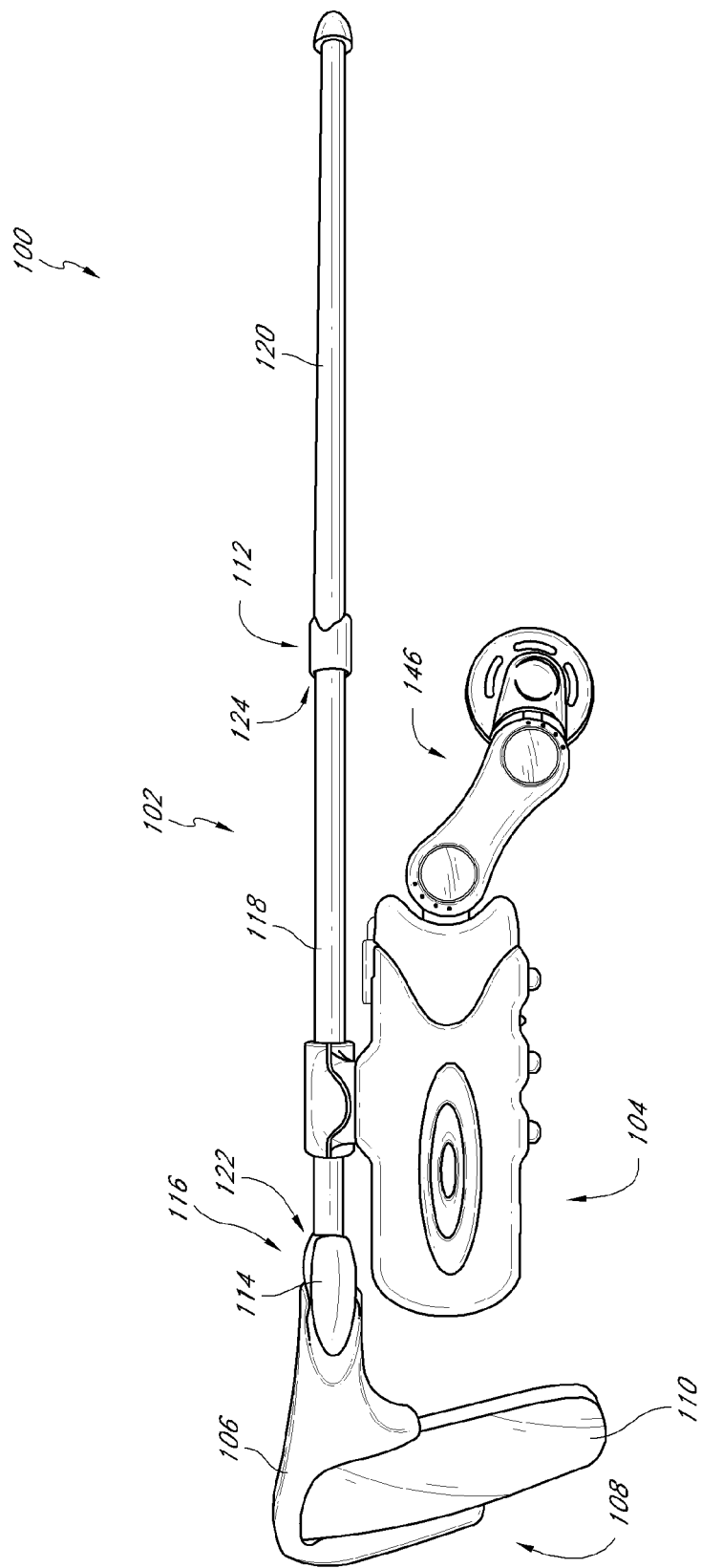
FIG. 1 is a side view of a support assembly in accordance with one embodiment of the present invention.

A support assembly 100 in accordance with one embodiment of the present invention is illustrated in FIG. 1. The support assembly 100 generally includes a support 102 and a detachable module 104, and can be any structure worn by a wearer that is adapted to carry, hold, or contain another device, such as an electronic device. For example, the support assembly 100 can be or include an audio device. In addition, the support assembly 100 can include an eyeglass frame, sports or other protective goggle, or other eyewear assembly. Although generally described herein as a detachable module, the module 104 can also be permanently mounted (by rigid fixation, or adjustably as disclosed in greater detail below) to the earstem, slide rail or other component of the eyeglass or other headwear.

The support 102 is generally any structure of capable of being worn that is also able to carry a device such as an electronic device. The support 102 can include any of a variety of wearable structures such as, for example, a hat, a belt, a vest, an article of clothing, and/or eyewear, including eyeglasses.

The detachable module 104 is any structure capable of being carried by the support 102. In one embodiment, the detachable module 104 includes a housing, containing an electronic assembly, as is described in greater detail below.

In the illustrated embodiment, the support 102 includes eyeglasses, which have a frame 106 that can include at least one orbital or lens support 108. The orbital 108 is adapted to hold at least one lens 110 in the field of vision of the wearer of the support assembly 100.

The support 102 also includes at least one earstem 112. The earstem 112 is coupled to the frame 106 with a coupling 114 located at the anterior portion 116 of the earstem 112. In one embodiment, the coupling 114 is a hinge, although the coupling 114 can be any structure known to those of skill in the art for coupling an earstem 112 to a frame 106. In other embodiments, the support 102 does not include a coupling 114. In such embodiments, the earstems 112 are integrally formed with the frame 106.

The earstem 112 includes a support section or rail 118 and a head contacting portion 120. The rail 118 is designed to engage a corresponding clamp on the detachable module 104. The detachable module 104 is detachably coupled to the rail 118 by any of a variety of mechanisms, such as those described in greater detail below. The detachable module 104 is adapted to move with respect to the rail 118. In one embodiment, the detachable module 104 moves along the rail's longitudinal axis in an anterior-posterior (or posterior-anterior) direction. Axial movement of the detachable module 104 with respect to the rail 118 may be limited in the anterior direction by an anterior stop 122, and in the posterior direction by a posterior stop 124.

The head contacting portion 120 of the earstem 112 can be provided with an elastomeric traction device, such as that disclosed in U.S. Pat. No. 5,249,001, filed Aug. 27, 1991, which is incorporated by reference herein. A padded portion on the head contacting portion 120 is generally made from a soft material, such as a foam, a plastic, cloth, or any of a variety of soft polymers, and provides a comfortable interface between the wearer's head and the support assembly 100 when worn by a user.

In one embodiment, the detachable module 104 includes one or more of a communication module, a music module, an audio-video module, and/or another electronics module. In one embodiment, the detachable module 104 is a communications module that allows the wearer of the support assembly 100 to wirelessly communicate with an electronic device. For example, the detachable module 104 can include one or more of a speaker, a microphone, a power supply and a Bluetooth or other radio frequency transceiver for wirelessly communicating with a remote device such as a cellular telephone.

Figure 2:
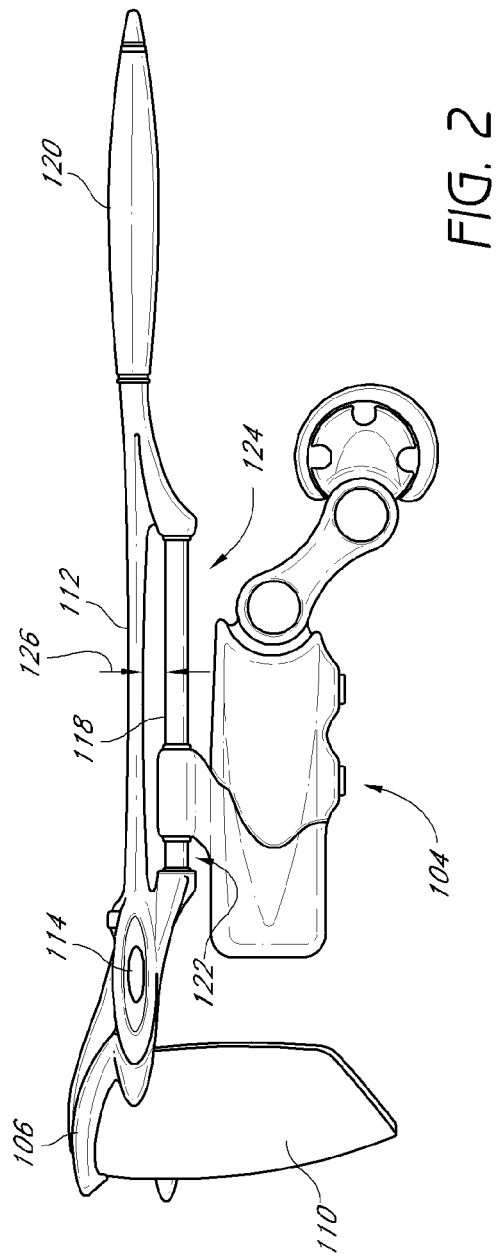
FIG. 2 is a side view of another support assembly in accordance with another embodiment of the present invention.

In the embodiment illustrated in FIG. 1, the rail 118 is a longitudinal segment of the earstem 112. In the illustrated embodiment, the rail 118 is concentric with the longitudinal axis of the earstem 112. However, in other embodiments, such as illustrated in FIG. 2, the rail 118 is spaced an offset distance 126 from the longitudinal axis of the earstem 112.

Figure 2A:
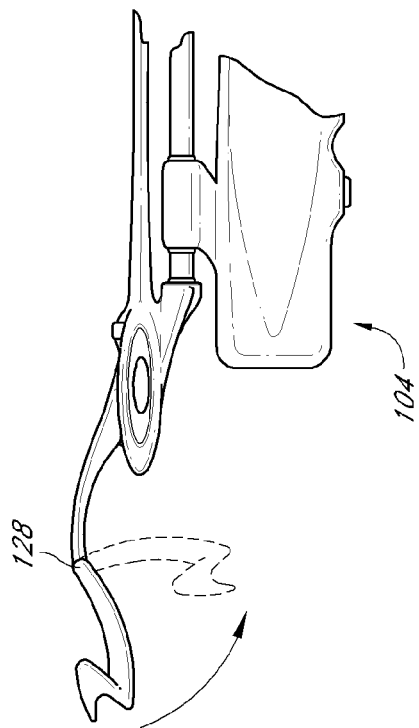
FIG. 2A is a partial side view of the support assembly of FIG. 2 showing lenses moved out of a wearer's field of view.

The orbitals 108 of the support 102 can be integrally formed with the frame 106, such as illustrated in FIG. 1. However, in other embodiments, the orbitals 108 are hingably connected to the frame 106 such as illustrated in FIG. 2A. In the embodiment of FIG. 2A, an orbital hinge 128 couples the orbital 108 with the frame 106. By hingably coupling the orbital 108 to the frame 106, the lenses 110 may be rotated about a hinge axis and moved out of the wearer's line of sight when desired. For example, if lenses 110 include sunglass lenses then orbital hinge 128 allows the wearer of the support assembly 100 to lift the lenses 110 out of the field of view when the wearer moves indoors without removing the support assembly 100 from his head. In any of the embodiments herein, the lenses may be supported in a "rimless" design as is understood in the art, in which the lens is attached to the frame or other adjacent components without the use of an orbital.

Figure 3:
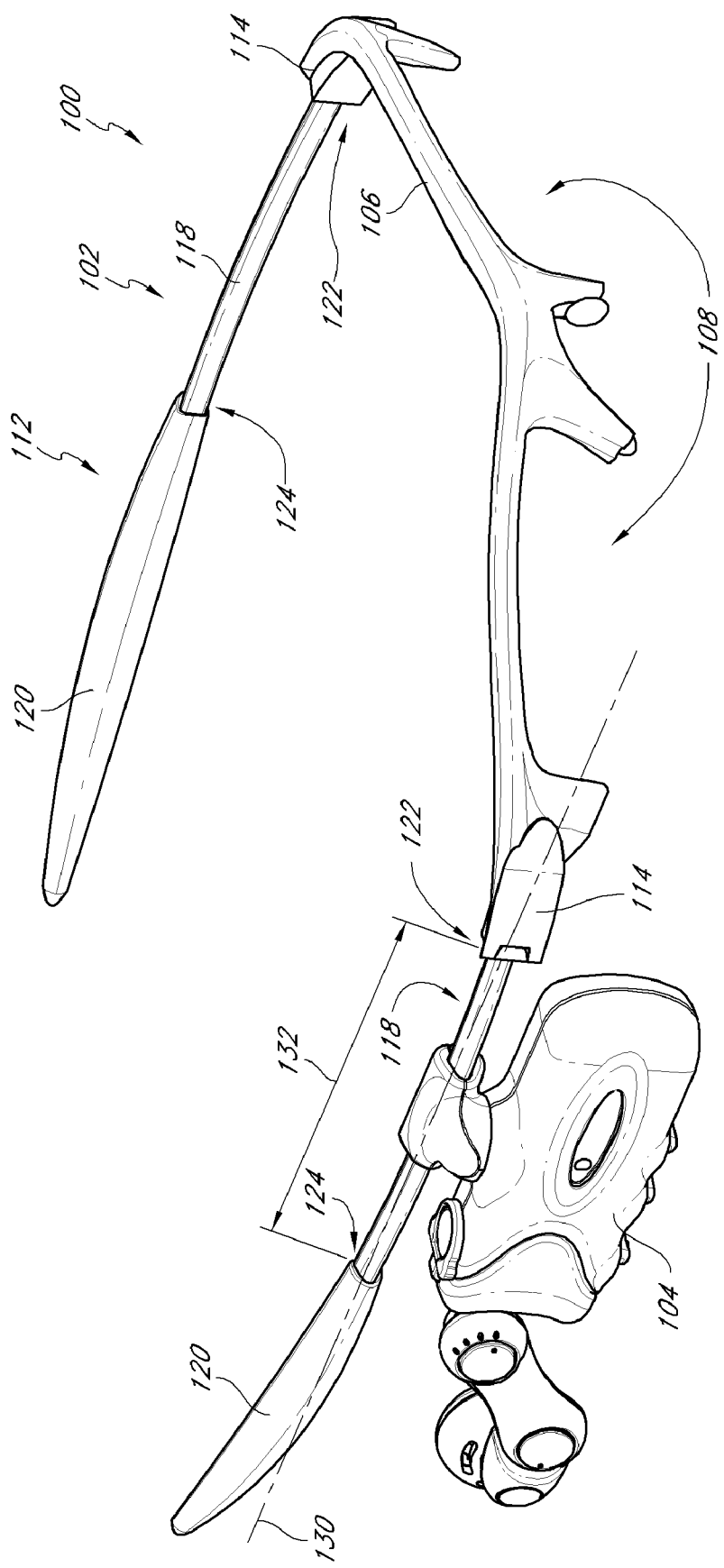
FIG. 3 is a perspective view of another support assembly in accordance with another embodiment of the present invention.

Another embodiment of a support assembly 100 is illustrated in FIG. 3. In the illustrated embodiment, at least a portion of the rail 118 has a non-round cross-sectional shape to prevent undesired rotation of the detachable module 104 about the rail 118 longitudinal axis 130. The rail 118 cross-sectional shape may be any of a variety of shapes, including noncircular shapes to prevent undesired rotation. For example, in one embodiment, the rail 118 cross-sectional shape is oval, elliptical, square, triangular, or any other non-circular shape. In one embodiment, the rail 118 includes an edge extending along a portion of its longitudinal axis 130, which prevents rotation of the detachable module 104 about the rail 118. The module clamp may be provided with complementary clamping surfaces, for conforming to the cross sectional configuration of the rail to permit axial (anterior-posterior) adjustability while resisting or preventing rotation about the axis of the rail.

In addition, any of a variety of anti-rotational structures may be provided with, or coupled to the rail 118 and the detachable module 104. For example, the anti-rotational structure can include a high friction surface to provide a friction fit, a locking arrangement, a pin, or any other structure known to those of skill in the art. In other embodiments, the rail 118 has a substantially circular cross-sectional shape and the detachable module 104 includes a suitable structure for preventing rotation of the detachable module 104 about the rail 118 longitudinal axis 130. For example, the detachable module 104 can include a friction mount, a rubber or elastomeric polymer pad, or other locking mechanism to prevent rotation about the rail 118.

The anterior stop 122 and posterior stop 124 define an adjustment length 132 over which the detachable module 104 may be repositioned with respect to the frame 106. In one embodiment, the adjustment length 132 is at least about one half inch, often at least about an inch, sometimes at least about two inches, and other times at least three inches or more. The adjustment length 132 defines a range of travel 134 of the detachable module 104 and other components coupled thereto (such as a speaker), as described in greater detail below.

The rail 118 can be located at any of a variety of locations with respect to the frame 106. In general, the rail 118 is located in the anterior two-thirds of the earstem 112. Alternatively, the rail 118 is in the anterior half of the earstem 112.

One embodiment of a detachable module 104 is illustrated in FIGS. 5-11. The detachable module 104 includes a housing 140 and a coupling 142. The coupling 142 allows the detachable module 104 to be removably connected to the earstem 112 of support 102 of the support assembly 100. Coupling 142 also provides adjustability of the position and angular orientation of the detachable module 104 with respect to the support 102.

The detachable module 104 also includes at least one speaker 144. The illustrated speaker 144 is adjustably carried by the detachable module 104 may with an arm 146. The detachable module 104 may also include a port cover 148 to cover a data port as will be described in greater detail below.

When the support assembly 100 is worn on the wearer's head, the position of the detachable module 104 with respect to the support 102 may be adjusted so that the speaker 144 comfortably resides at least partially over the wearer's ear. Additional details regarding the adjustability of the speaker 144 with respect to the detachable module 104 and the support 102 will be described in greater detail below with respect to FIG. 18 and FIGS. 19-22. In addition, further multiaxial adjustability structures are disclosed in U.S. patent application Ser. No. 11/022,367, filed Dec. 22, 2004, and U.S. patent application Ser. No. 10/993,217, filed Nov. 19, 2004, the disclosure of which are incorporated in their entireties herein by reference.

Figure 5:
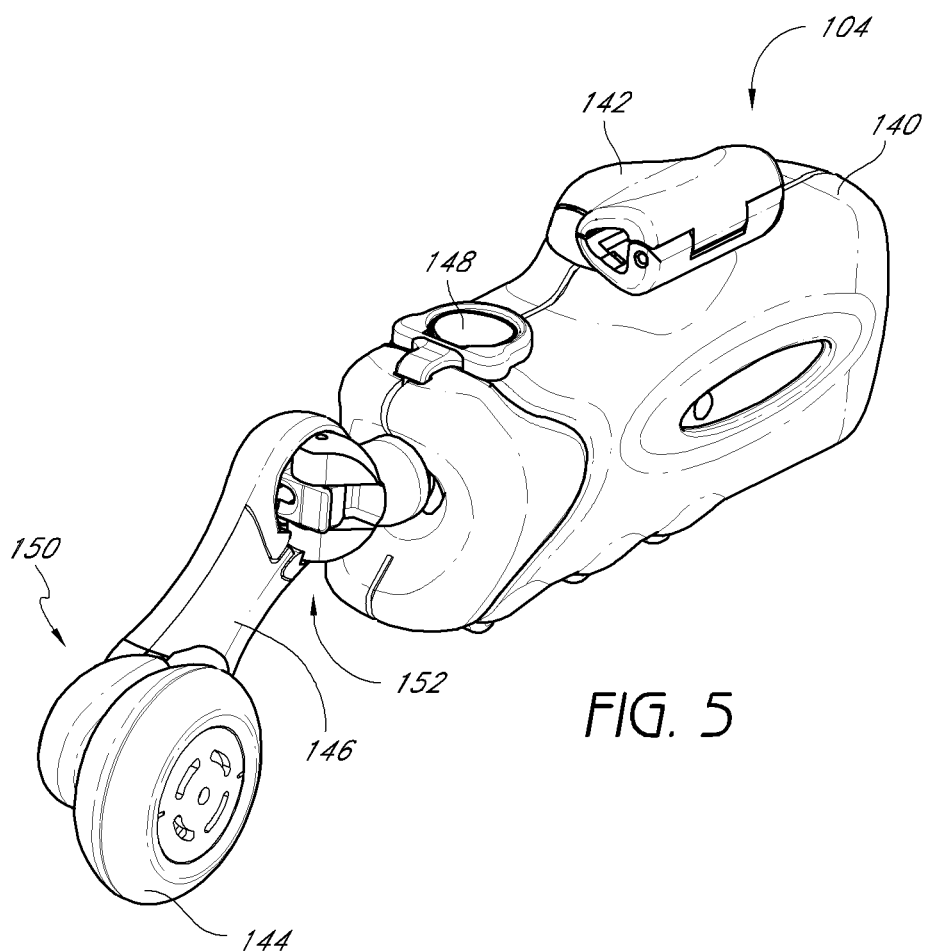
FIG. 5 is a perspective view of a detachable module in accordance with one embodiment of the present invention.
Figure 6:
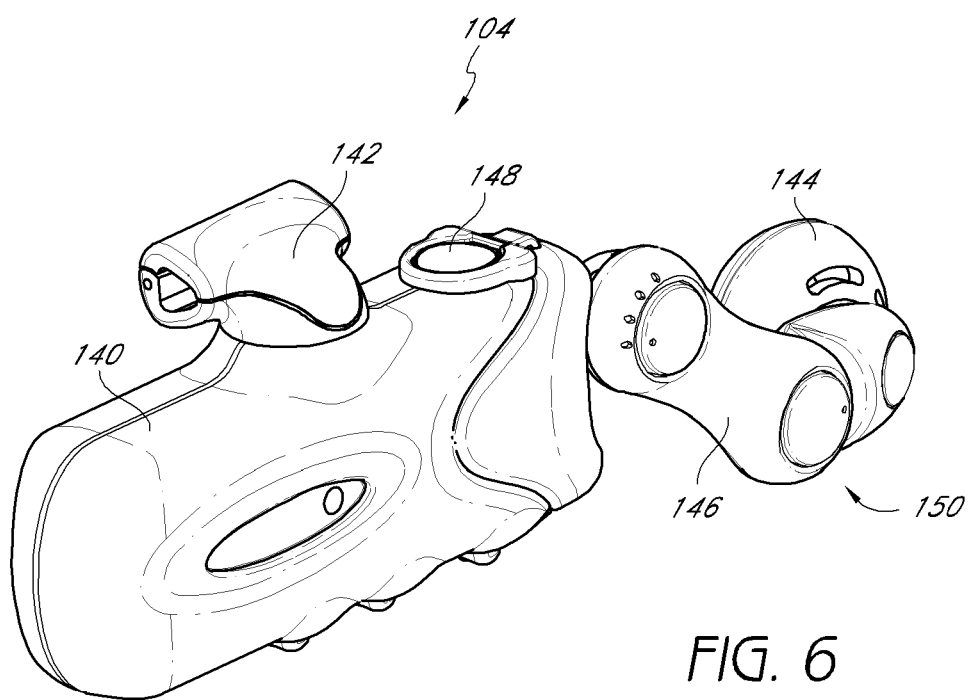
FIG. 6 is another perspective view of the detachable module of FIG. 6.
Figure 7:
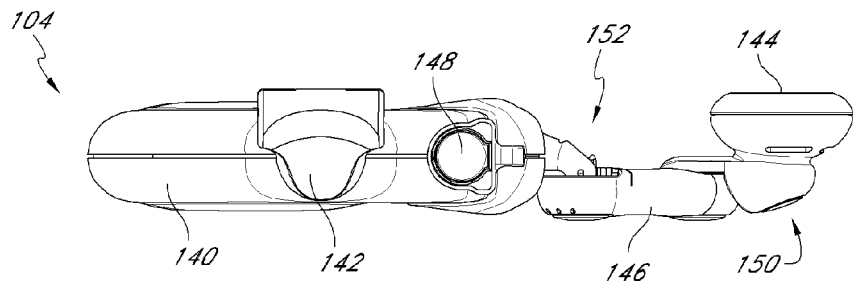
FIG. 7 is a top view of the detachable module of FIG. 5.

In one embodiment, such as that illustrated in FIG. 5, a speaker 144 is coupled to an arm 146 at a speaker pivot 150. The speaker pivot allows adjustment of the position of the speaker 150 with respect to the arm 146. The arm 146 is coupled to the housing 140 of the detachable module 104 at an arm pivot 152.

Figures 8, 9:
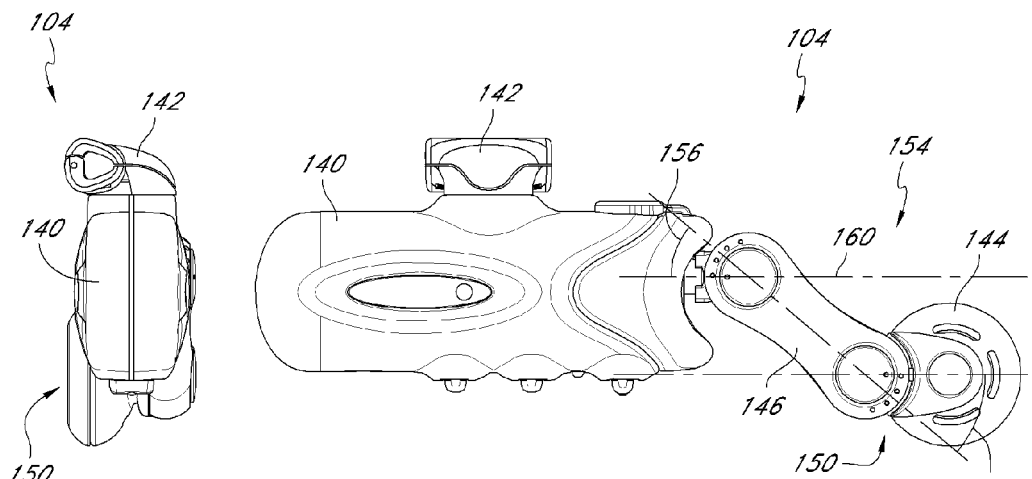
FIG. 8 is a side view of the detachable module of FIG. 5.
FIG. 9 is an end view of the detachable module of FIG. 5.
Figure 10:
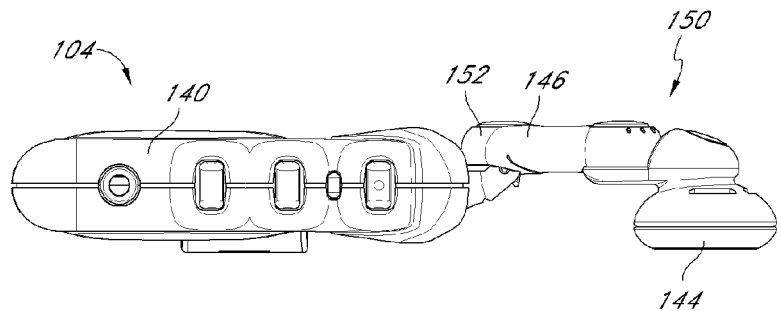
FIG. 10 is a bottom view of the detachable module of FIG. 5.
Figure 11:
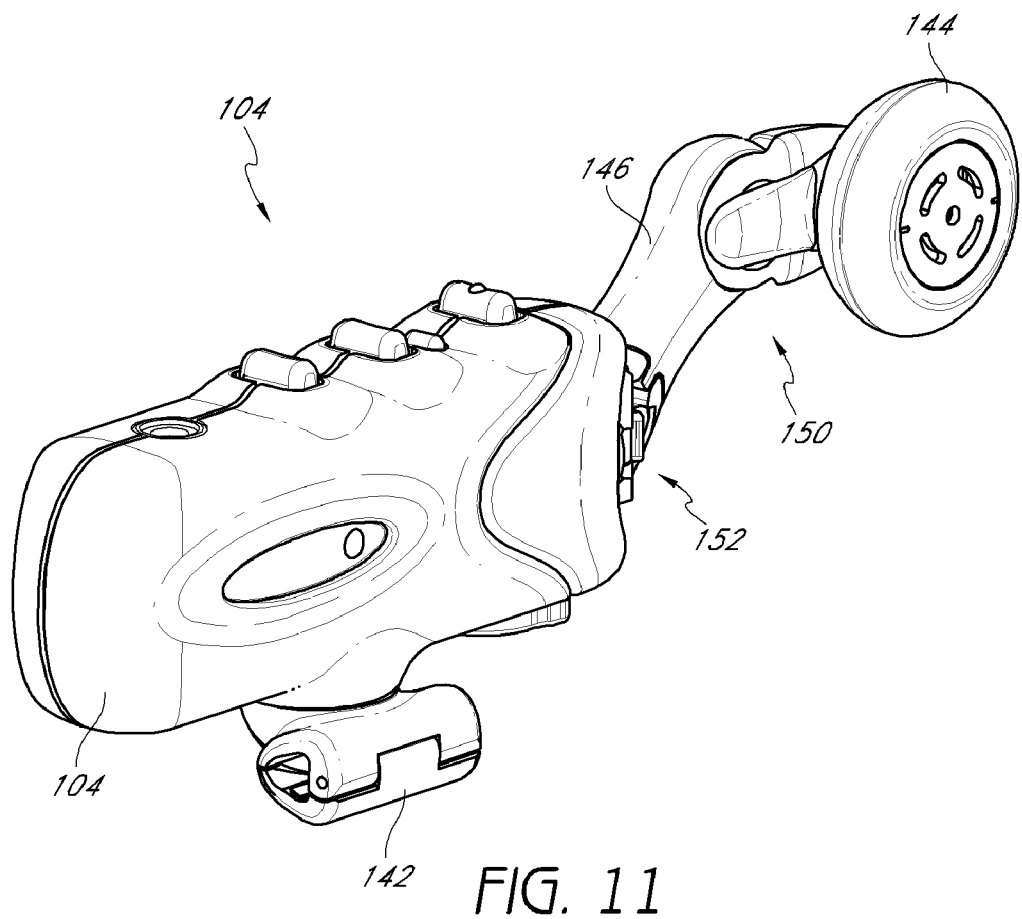
FIG. 11 is another perspective view of the detachable module of FIG. 5.

Arm pivot 152 is any of a variety of mechanical structures able to allow one member to adjust in at least its angular orientation in at least one dimension with respect to another. For example, as illustrated in FIG. 8, the arm pivot 152 allows inferior and superior movement of the distal end 154 of the arm 144, thereby adjusting a first arm angle 156. The first arm angle 156 is generally in the range of from about 3° to 45°, often from about 5° to 25°, sometimes about 10° to 25°, and in some embodiments, greater than at least 10°.

Figure 4:
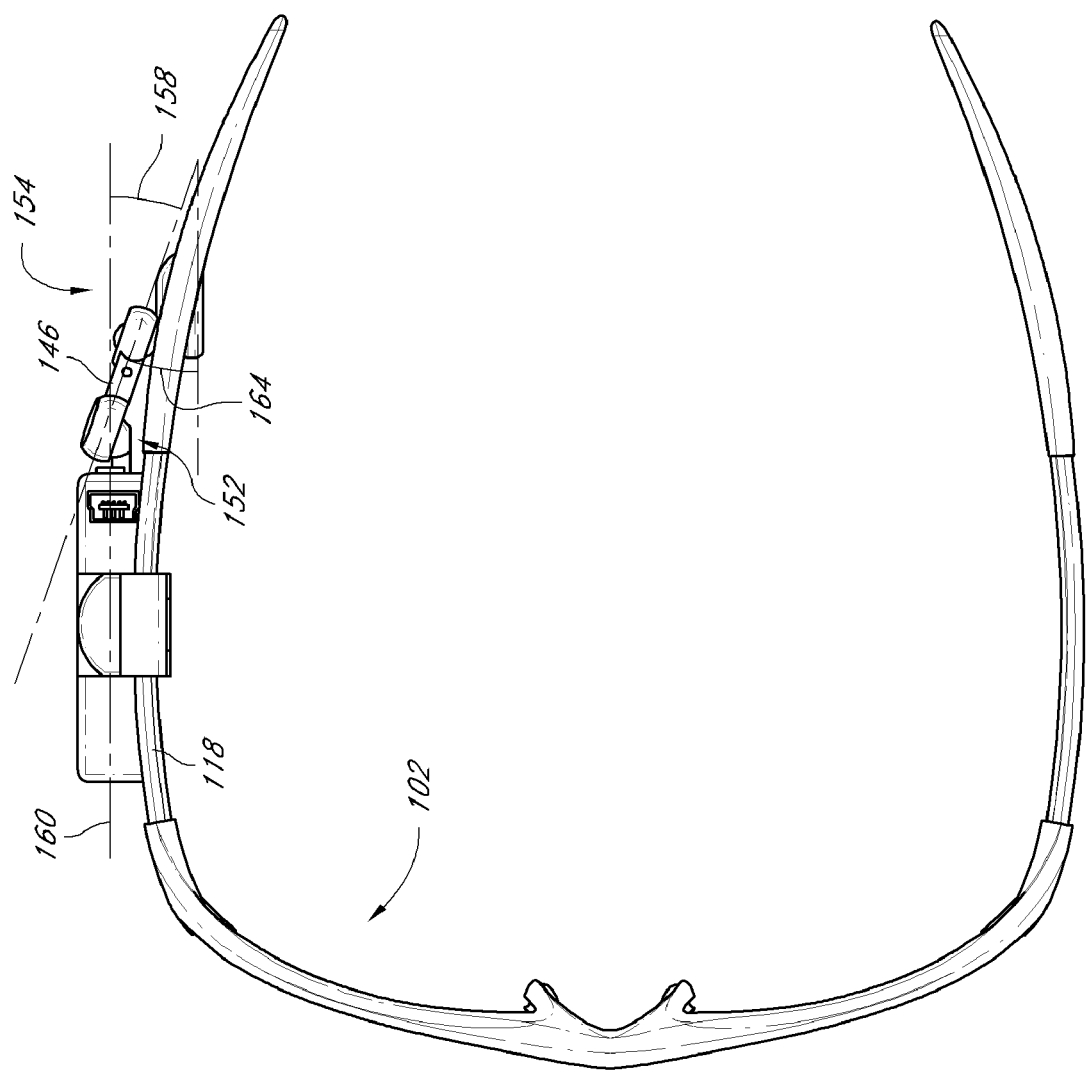
FIG. 4 is a top view of the support assembly of FIG. 5.

In addition, the distal end 154 of the arm 146 can be moved in a lateral direction, thereby adjusting second arm angle 158, as best seen in the view of FIG. 4. The second arm angle 158 is generally in the range of about 2° to 25°, often about 5° to 15°, and in some embodiments, about 10°.

In addition, the arm pivot 152 provides rotational movement of arm 146 with respect to the housing 140 of the distal module 104. For example, in one embodiment, arm pivot 152 allows arm 146 to be rotated at least 180° about the housing axis 160, as will be described in greater detail below.

The speaker pivot 150 provides similar adjustability of the speaker 144 with respect to the arm 146. For example, as illustrated in FIG. 8, the speaker pivot 150 allows movement of the speaker 144 to a desired first speaker angle 162. In addition, as illustrated in FIG. 4, a second speaker angle 164 may also be selected by rotating the speaker 144 about the speaker pivot 150.

Adjustability of the detachable module 104 with respect to the support 102, adjustability of the arm 146 with respect to the housing 140, and adjustability of the speaker 144 with respect to the arm 146 allow full adjustability and positioning of the position of the speaker 144 with respect to a user's ear when the support assembly 100 is worn by a user. In addition, the adjustability provides improved comfort for the wearer.

Figure 12:
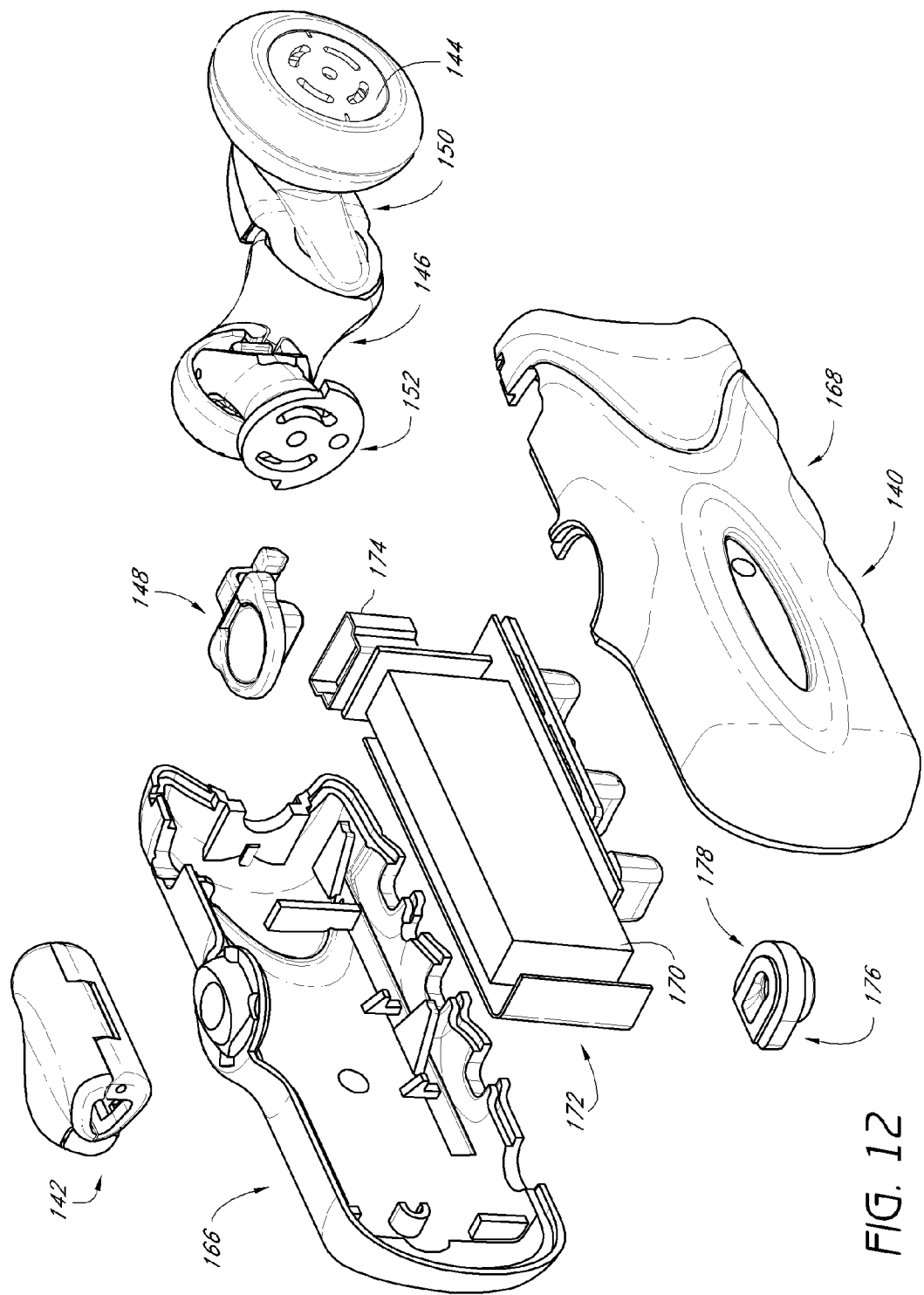
FIG. 12 is an exploded view of the detachable module of FIG. 5.

An exploded view of one implementation of detachable module 104 is illustrated in FIG. 12. The detachable module 104 includes a housing 140, which includes a first body portion 166 and a second body portion 168. The housing 140 is formed by attaching the first body portion 166 to the second body portion 168 along a part line, to provide a protective outer wall which defines at least one interior cavity for housing electronics. At least partially inside of the housing 140 are a power module 170, an electronics module 172, a data port 174 and a holder 176 that supports a microphone 178. The body portions 166, 168 may be made from any of a variety of materials, including plastic or metal. Alternatively, the module 104 can be formed entirely or partially by insert molding or co-molding processes to produce embedded electronics in a unitary or monolithic module.

The power supply 170 is any of a variety of power structures able to power a detachable module 104. For example, power module 170 may include a battery, a capacitor, or other power supply.

The electronics module 172 includes electronics for receiving signals from an external source and providing audio signals to the wearer through the speaker 144, such as for receiving audio, audio-video or video only signals. In addition, the electronics module 172 may also allow signals received by the electronics module 172 through the microphone 178 to be transmitted to a external receiver. For example, in one embodiment, electronics module 172 includes a Bluetooth transceiver.

Data port 174 is any port for coupling the detachable module 104 to an external source through a wired or wireless connection. For example, in one embodiment, data port 174 is a mini-USB port, a USB port, a fire wire port, an IEEE 1394 connection port, or any other data port. A holder 176 can be provided to secure the microphone 178 in place. In one embodiment, the holder 176 includes a grommet, such as any of those known to those of skill in the art. In addition, the holder 176 can also include a windscreen to filter wind noise from being received by the microphone 178.

Any of a variety of couplings can be utilized with the module 104 of the present invention, for releasably or permanently attaching the module 104 to an eyeglass frame or other support. In many application, releasable connection is preferred. The coupling may be an integral component of the module 104, or may be attached to the module 104. In general, the coupling will include at least a first coupling surface for contacting a first surface on the rail or other support from which the coupling will depend, and a second coupling surface for contacting a second surface on the support. The first and second coupling surfaces are generally moveable with respect to each other, such as to permit positioning the coupling over or around the structure to which it is to be attached, and then tightened to the structure by bringing the first and second coupling surfaces towards each other.

The configuration of the first and second coupling surfaces, or third or fourth or more, depending upon the design, can be provided with any of a variety of configurations. Normally, the coupling surfaces will be configured in a manner that cooperates with the complementary shape of the rail, earstem, or other component to which they are to be attached.

In an embodiment of the present invention in which the module 104 may preferably be attached at the user's choice to either a left earstem or a right earstem of an eyeglass, the coupling is preferably pivotably or otherwise moveably connected to the module 104, to permit shifting between a "right hand" and "left hand" coupling configuration. Certain specific examples will be given below. Alternatively, in certain embodiments of the invention, a left hand module and a right hand module will be sold as a system, such as for receipt of stereo signals for music, audio/visual sound tracking, or for use in a dual mono system such as cell phone. In this application, the coupling may be permanently mounted to the housing 104, in an immovable fashion, with a first module 104 adapted for coupling to left earstem and a second module 104 adapted for coupling to a right earstem. Certain specific embodiments of the coupling systems will be described below.

A coupling 142 in accordance with the present invention is illustrated in FIG. 13. In the illustrated embodiment, the coupling 142 includes an upper portion 180, a lower portion 182, and a pin 184. The pin 184 hingably connects the upper portion 180 with the lower portion 182. A mount 186 attached to or integrally formed with the lower portion 182 provides an attachment mechanism between the coupling 142 and the housing 140 of the distal module 104. The mount 186 also provides angular adjustability of the housing 140 with respect to the coupling 142. Additional details regarding angular adjustability in this regard will be discussed in greater detail below.

The coupling 142 can include any of a variety of locking mechanisms 188 to allow opening and closing of the coupling 142. The upper portion 180 is movable with respect to the lower portion 182 when the locking mechanism 188 is released. Such moveability of the upper and lower portions 180, 182 allow the coupling 142 to at least partially surround and enclose a portion of a rail (not shown), such as rail 118 described above.

In addition, the locking mechanism 188 can be released to remove the coupling 142 from the rail. In other embodiments, locking mechanism 188 loosens the grip of the coupling 142 on the rail so that the detachable module 104 can be slid along the rail, as described in greater detail above.

In one embodiment, the locking mechanism 188 has two states: a lock state and an open state. In the lock state, the coupling 142 may not be inadvertently moved along the rail under normal use conditions. In the open state, the coupling 142 may be moved along or removed from the rail.

Figure 14:
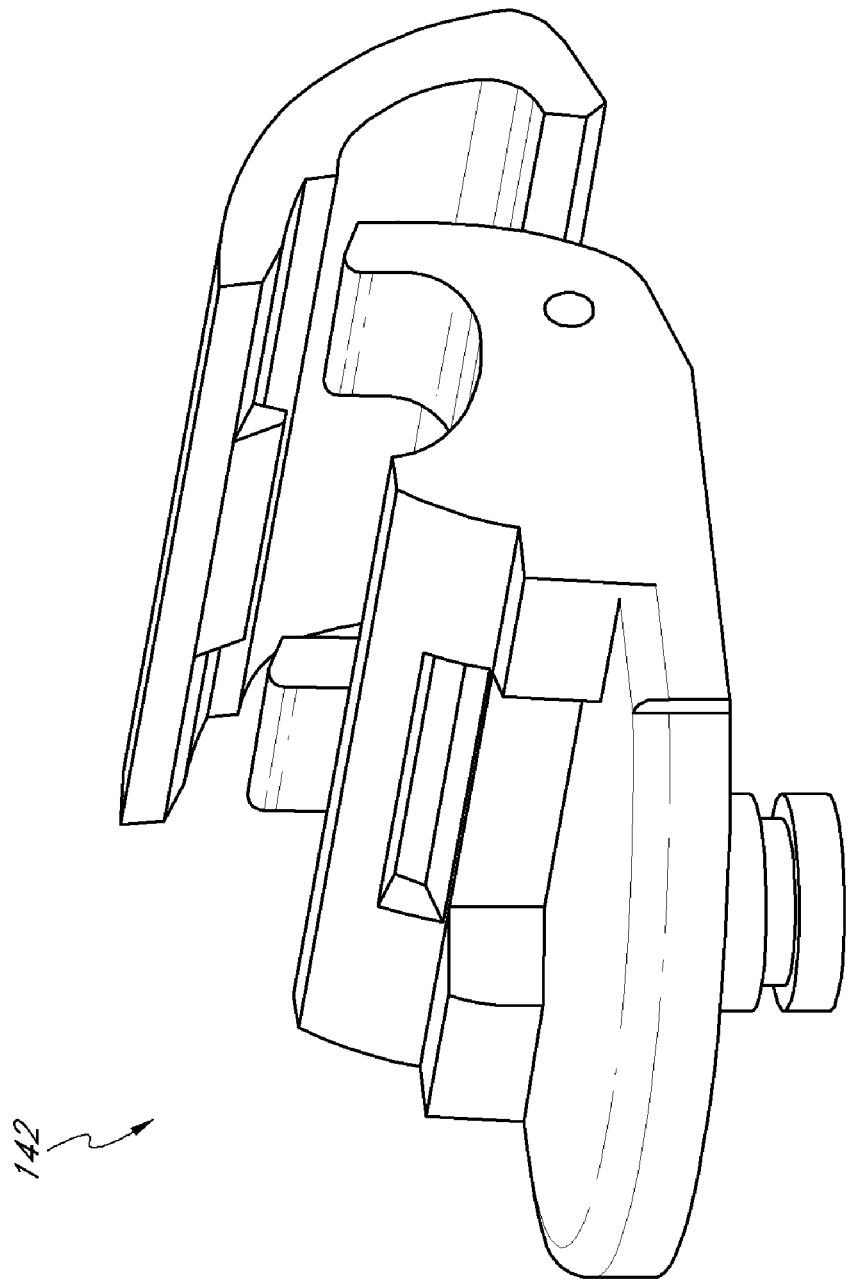
FIG. 14 is a perspective view of another coupler in accordance with another embodiment of the present invention.

In another embodiment, the locking mechanism 188 has three states: a lock state, an open state, and an adjust state. The lock and open states are the same as described above. The adjust state allows the coupling 142 to be moved or slid along the rail but does not allow the coupling 142 to be removed from the rail. Another embodiment of a coupling 142 shown in an open state is illustrated in FIG. 14.

Figure 15:
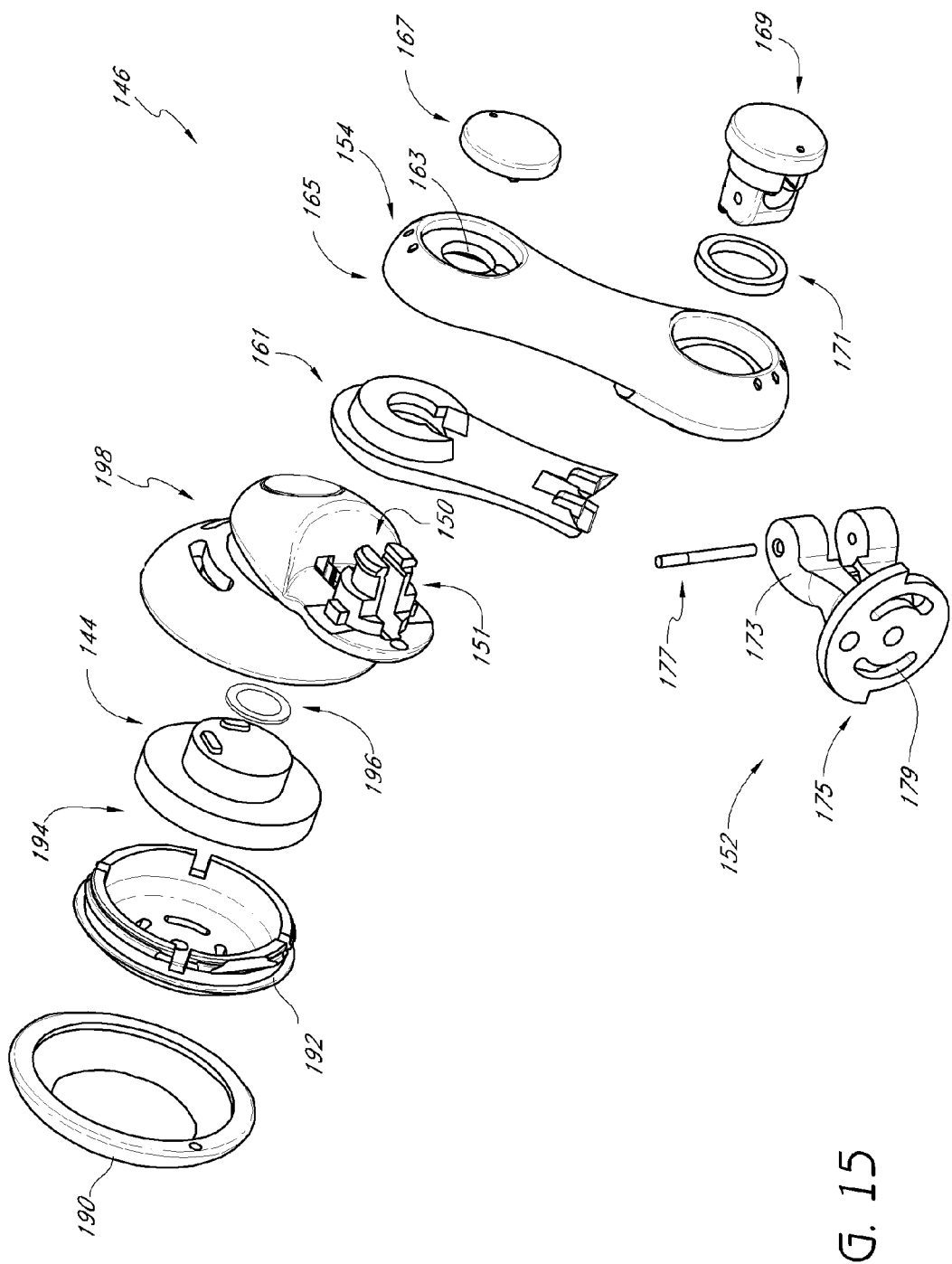
FIG. 15 is an exploded view of the speaker and arm of the detachable module of FIG. 5.

An exploded view of a speaker support arm 146 is illustrated in FIG. 15. A bellow 190 is provided over a grill 192, which at least partially covers speaker 144 over its sound output surface 194. A vent screen 196 resides between the speaker 144 and a bud 198. The speaker pivot 150 is formed by two laterally flexible tangs 151 that extend into and provide a rotatable snap fit within the orifice 163 of a boom 165. A cap 167 covers the tangs 151 of the speaker pivot 150. A cover 161 is placed between the bud 198 and the boom 165 to cover at least one surface of the boom 165, and enclose wires leading to the speaker 144.

A hub 169 extends through a ring 171 and through the boom 165 where it is pivotably coupled to the mating portion 173 of a base 175. A pin 177 removably and hingably couples the mating portion 173 to the hub 169 and therefore the boom 165. The arm pivot 152 is provided by the coupling of the base 175 and hub 169.

As discussed previously in connection with FIG. 4, the speaker and boom assembly may also be rotatably connected to the housing 104 about an axis 160, which extends in the illustrated embodiment in the anterior/posterior direction. This rotation may be accomplished by the provision of one or more arcuate slots 179, illustrated in FIG. 15, for receiving a pin or other complementary structure on the module 104, to permit rotation through a controlled range of motion as will be apparent to those of skill in the art in view of the disclosure herein.

In one embodiment, the speaker 144 is a rip curl speaker. In another embodiment, the speaker 144 has an outside diameter of no more than 9 mm, no more than about 11 mm, or about 13 mm or more.

Figure 16:
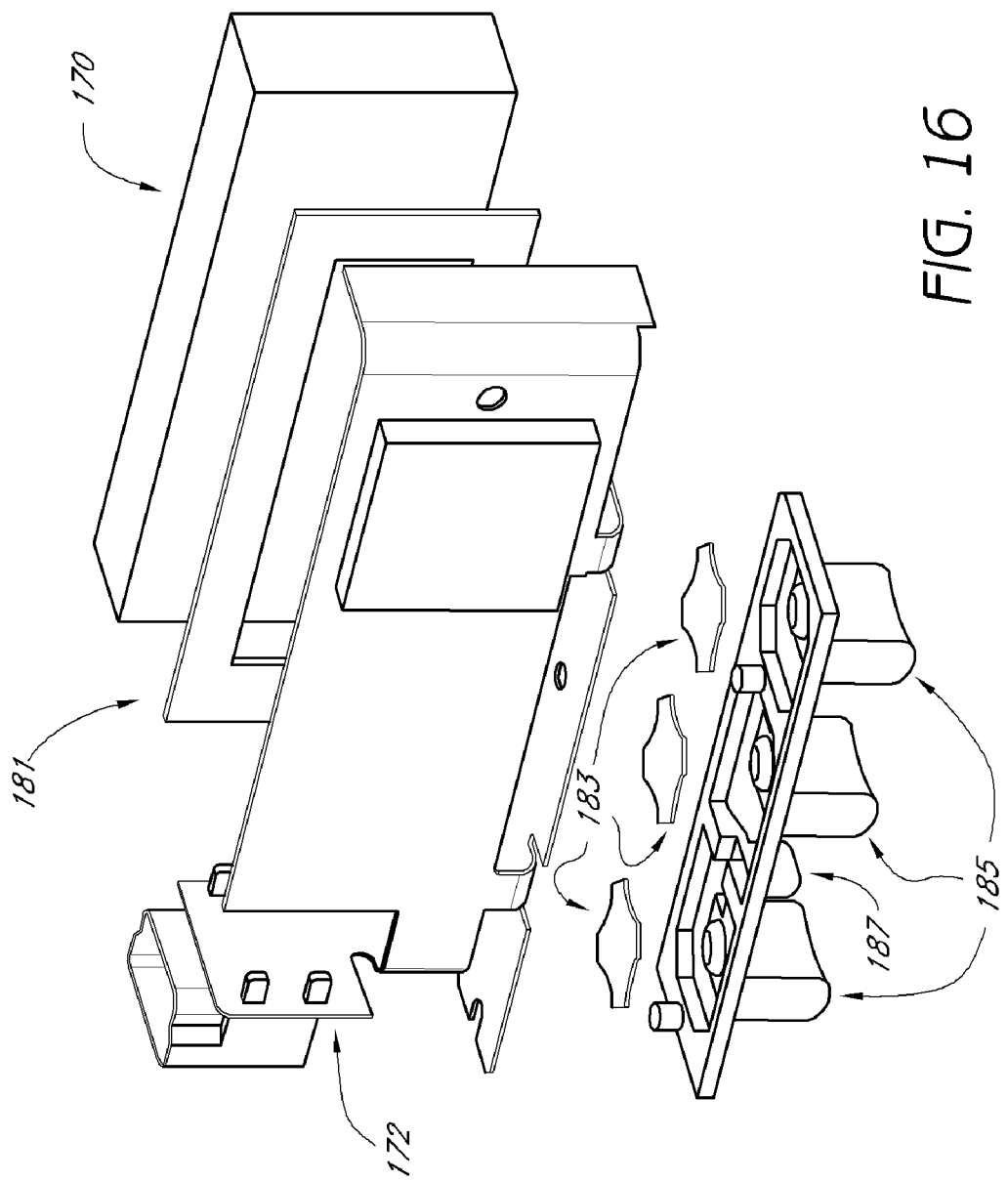
FIG. 16 is an exploded view of an internal assembly of the detachable module of FIG. 5.

Referring now to FIG. 16, the power module 170 can include a battery, such as an ATL501230 battery, as is well known to those of skill in the art. The power module 170 can be coupled to the electronics module 172 with an adhesive 181. The electronics module 172 can be coupled to micro switches 183 which are accessed by the user by pressing buttons 185. In one embodiment, the detachable module 104 includes three switches.

The switches can include any of a variety of switches known to those of skill in the art, including micro switches, snap switches, and dome switches. In one embodiment, the switches 183 are snap dome F06180 switches. The detachable module 104 can have three switches 183, although any number of switches 183 can be used. An LED 187 provides status indication to the wearer.

Figure 17:
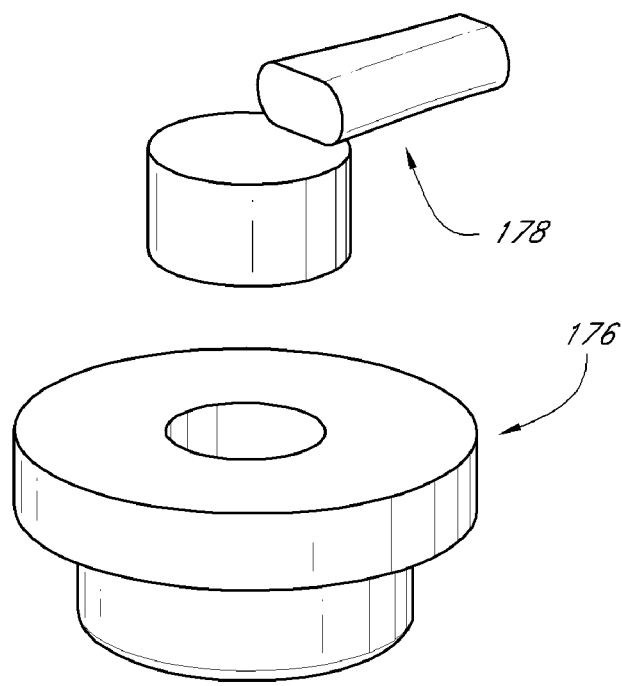
FIGS. 17 and 18 are perspective views of the grommet of the detachable module of FIG. 5.
Figure 18:
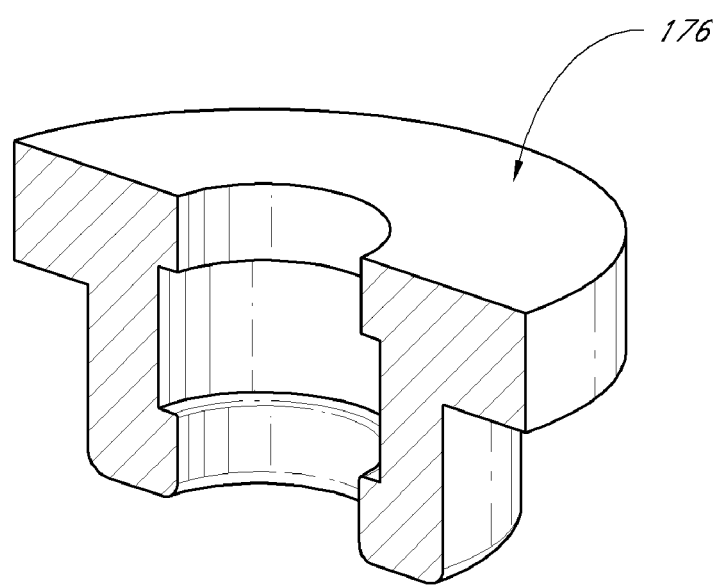

Referring now to FIGS. 17 and 18, the microphone grommet 176 of the detachable module 104 can be made from any of a variety of materials well known to those of skill in the art, including: PTFE, polyethylene, polyurethane, or TPE. In addition, the grommet 176 can have a hardness or stiffness of about 20 to 30 durometers, about 40 to 50 durometers, about 60 durometers, or about 70 durometers.

A windscreen can be provided with the grommet 176 to reduce noise. For example, in one embodiment, the windscreen is a Saatifil screen. The microphone 178 can be any of a variety of microphones known to those of skill in the art, including a star microphone, such as microphone Part No. MAA-03A-L60.

Figure 19:
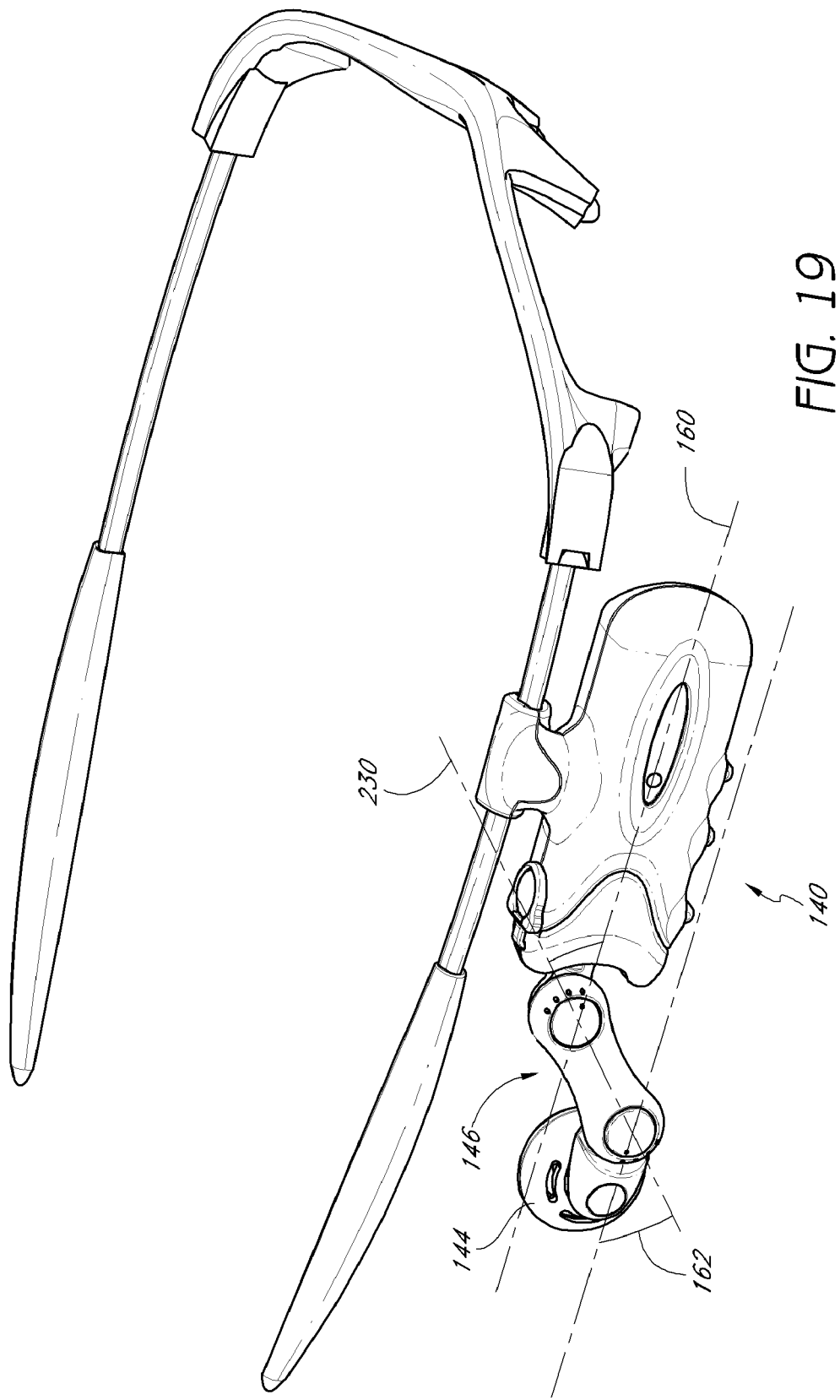
FIGS. 19 and 20 show one aspect of the angular adjustability of the speaker and arm of the detachable module of FIG. 5.
Figure 20:
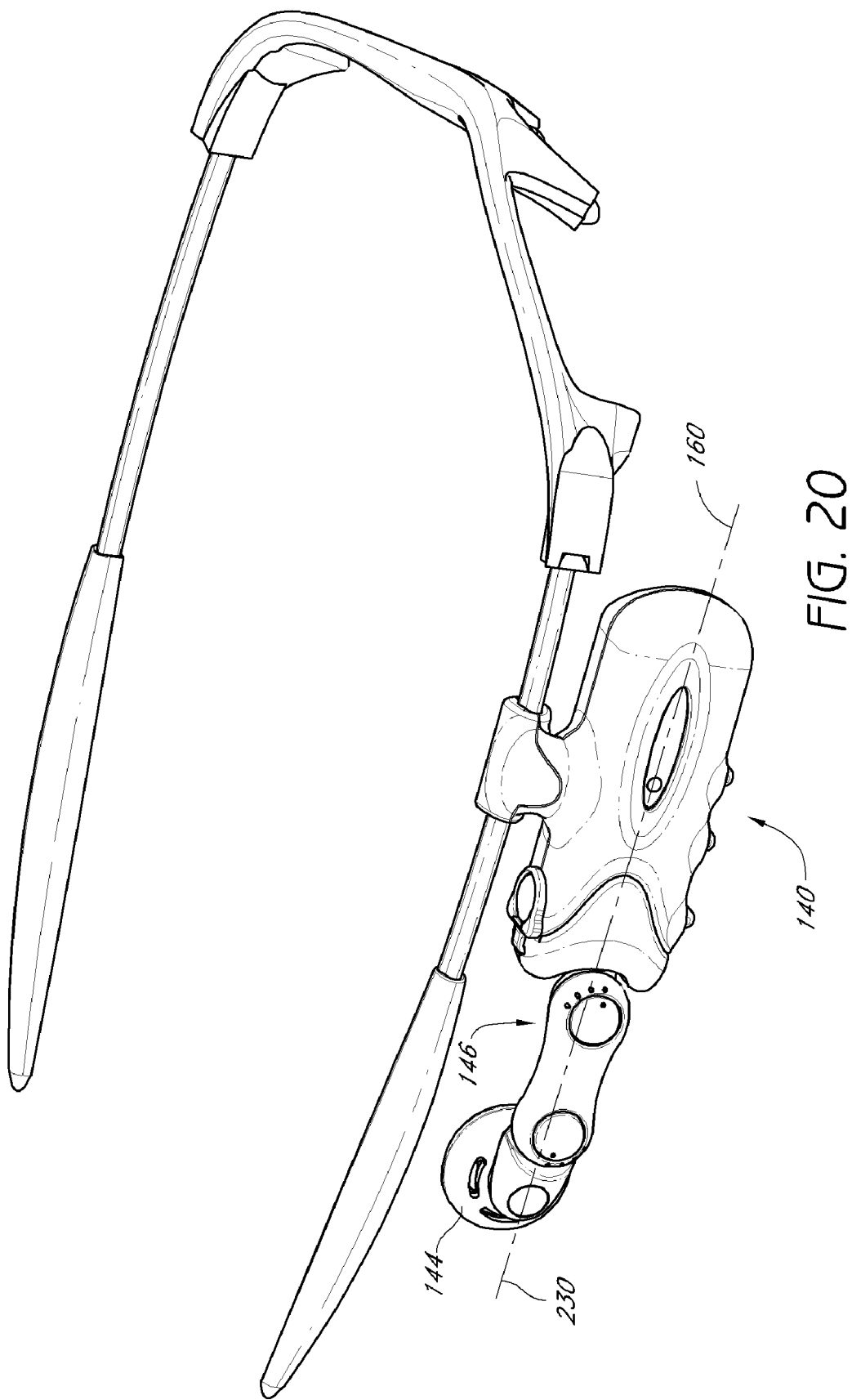

Referring now to FIGS. 19 and 20, and as discussed above, speaker and arm pivots 150, 152 allow movement of the speaker 144 and arm 146 with respect to the detachable module 104 housing 140. In one embodiment, the first speaker angle 162 over which the speaker 144 may be moved, is up to about 100 degrees. In another embodiment, the first speaker angle 162 is about ±45 degrees with respect to the arm axis 230. In another embodiment, the first speaker angle 162 is at least about ±5 degrees, sometimes at least about ±20 degrees, and sometimes at least about ±45 degrees.

In one embodiment, the detachable module 104 can be adjusted so that the speaker, arm, and housing 140 are aligned along the housing axis 160 as illustrated in FIG. 20.

Figure 21:
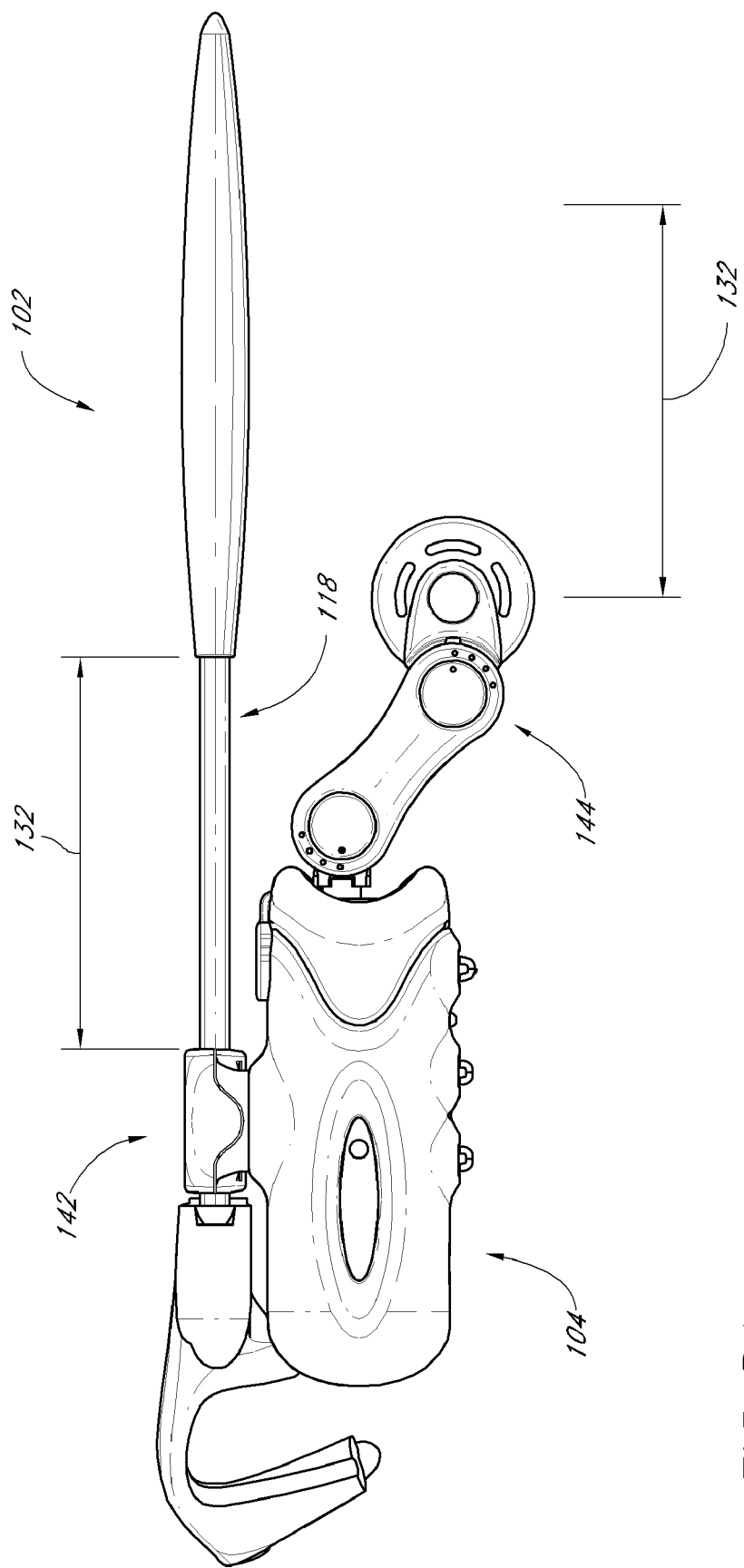
FIGS. 21 and 22 show one aspect of the linear translation and position adjustability of the detachable module of FIG. 5.
Figure 22:
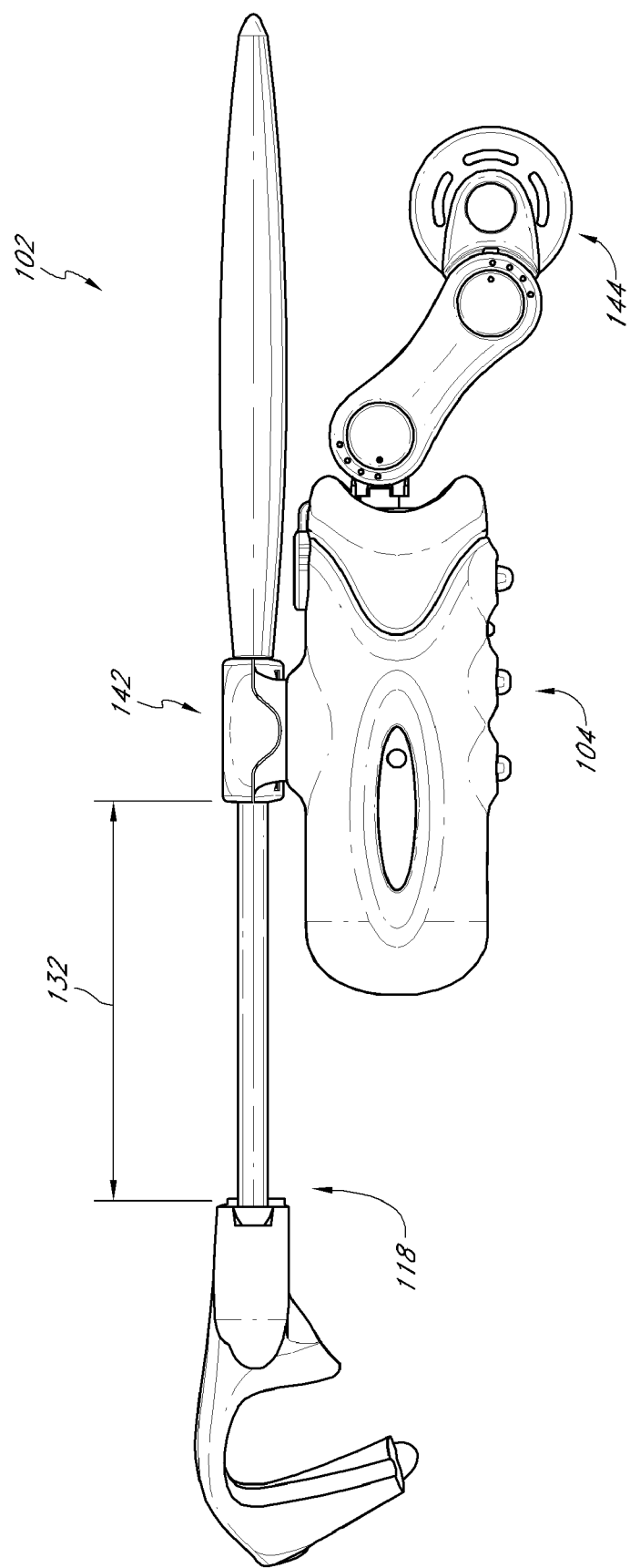

Referring now to FIG. 21, movement of the coupling 142 with respect to the rail 118 over an adjustment length 132 results in a corresponding translation of the detachable module 104 with respect to the support 102. In addition, movement of the coupling 142 over the rail 118 over the adjustment length 132 or a portion thereof will result in a related movement of speaker 144 with respect to the support 102 and with respect to the wearer's ears. Although FIGS. 21 and 22 show movement of the detachable module 104 over the entire adjustment length 132, in other embodiments, coupling 142 is used to move detachable module 104 only a portion of the full adjustment length 132.

Figure 23:
FIG. 23 shows the rotation of the coupling with respect to the housing of the detachable module of FIG. 5.

In one embodiment, the coupling 142 is released from the rail or other support by rotating the coupling 142 with respect to the housing 140. In one embodiment, the housing 140 is rotated at least about 45 degrees and preferably about 90 degrees to release the coupling 142. By releasing the coupling 142 as illustrated in FIG. 23, the detachable module 104 may be removed from the support 102. It may be desirable to remove the detachable module 104 from the support 102 to either change the detachable module 104 with another component, such as another detachable module that provides different functionality, or to mount the detachable module 104 on the opposite earstem 112 of the support 102.

Figure 24:
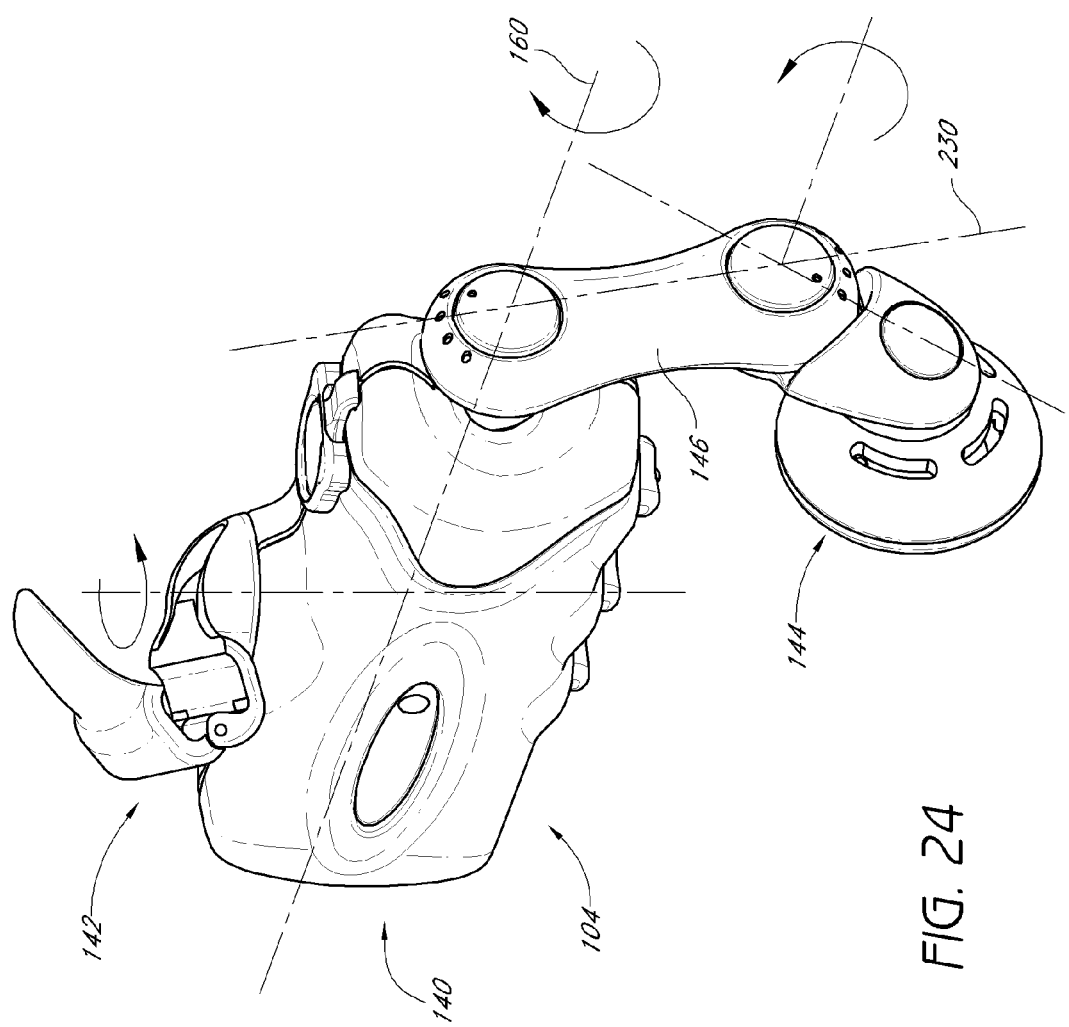
FIG. 24 shows the reversibility of the detachable module of FIG. 5 such that it may be moved from one earstem of a support to the other earstem.

To move the detachable module 104 from one earstem 112 of the support 102 to the opposite earstem 112, the coupling 142 is released, as illustrated in FIG. 24. The arm 146 is then rotated about the housing axis 160. In addition, the speaker 144 is rotated about the arm axis 230 as well. In addition, the coupling 142 can be rotated about a coupling axis 232 as well. Additional details regarding the lead positioning of the detachable module 104 from a right earstem 112 to a left earstem 112 are illustrated in FIGS. 25-28.

Figure 25:
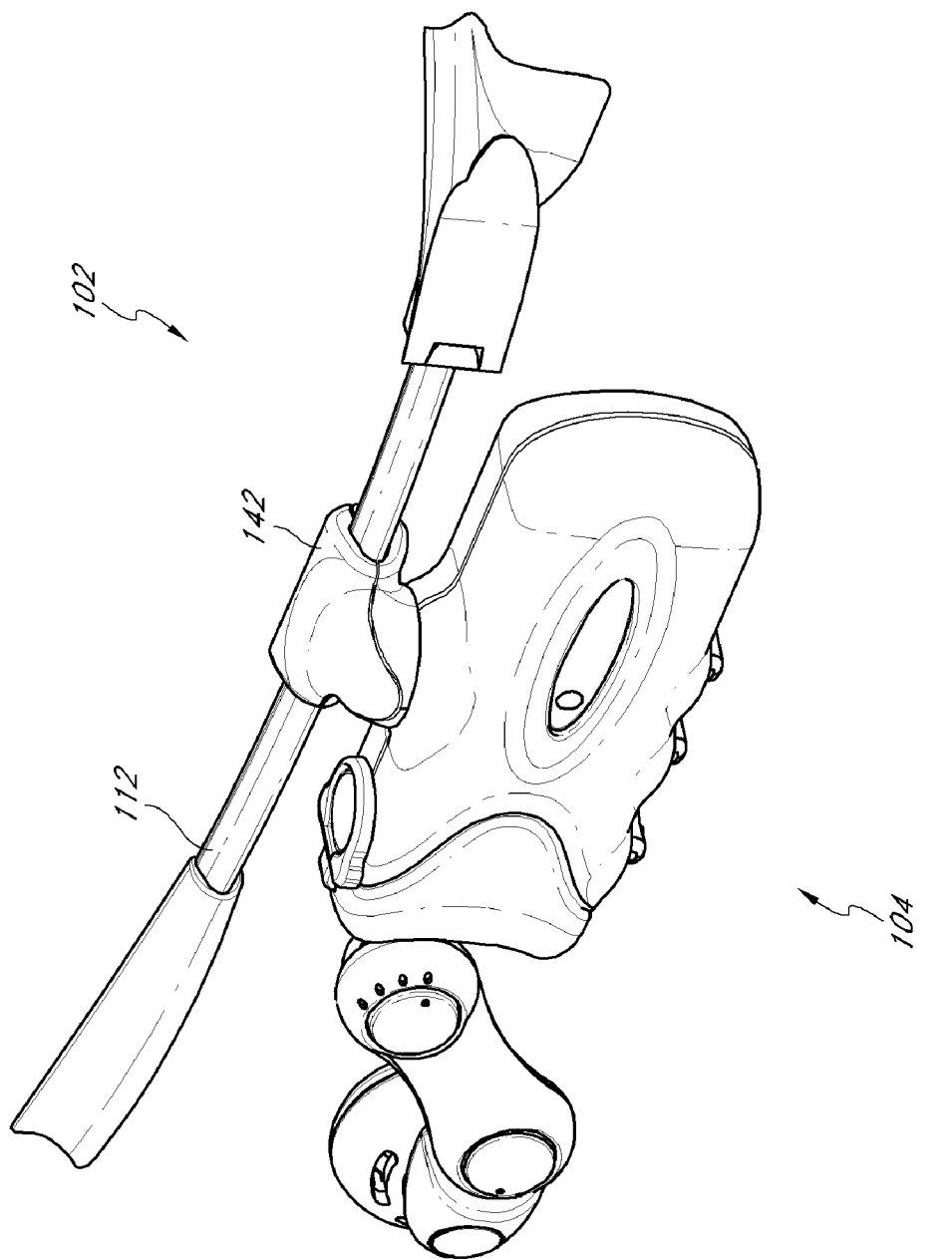
FIGS. 25 through 28 show the reversibility of the detachable module of FIG. 5.
Figure 26:
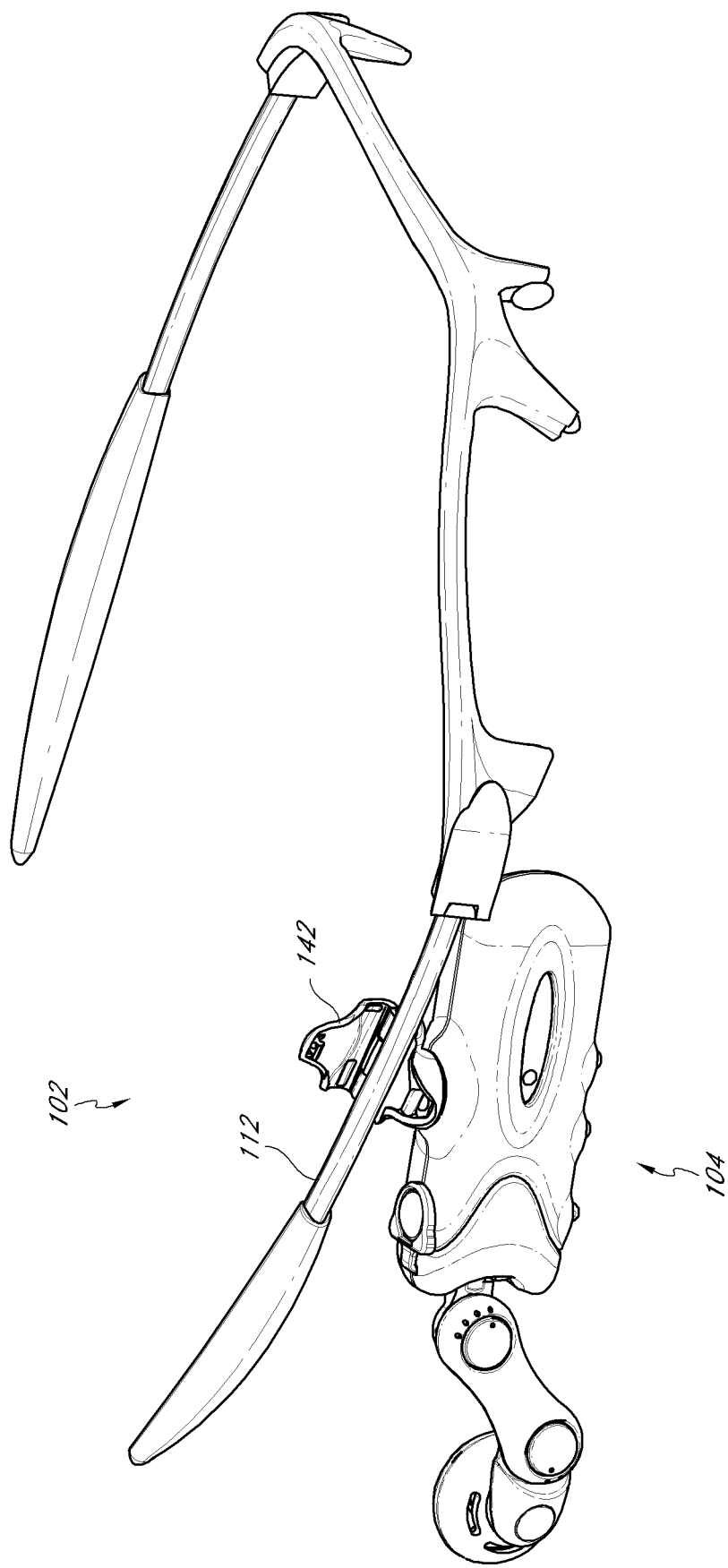
Figure 27:
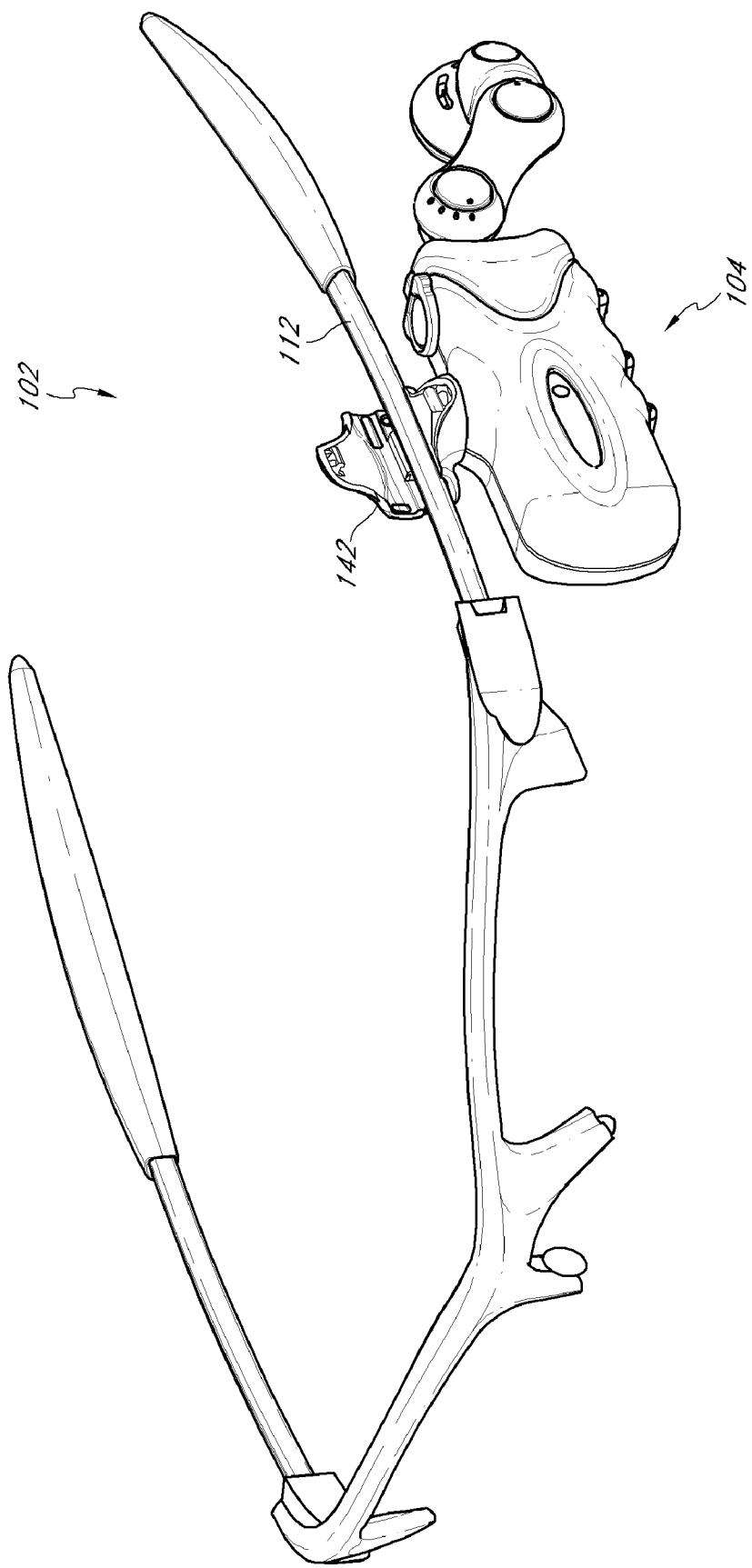
Figure 28:

In FIG. 25 a detachable module 104 is shown coupled to the right earstem 112 of a support 102. The coupling 142 is in its closed position to secure the detachable module 104 to the earstem 112. In FIG. 26 the detachable module 104 has been rotated with respect to the earstem 112 to release the coupling 142. The coupling 142 is shown in its open position such that the detachable module 104 can be removed from the earstem 112. The detachable module 104 is then positioned with respect to the left earstem 112, as illustrated in FIG. 27. The speaker 144 has been rotated about the arm axis 230 so that its acoustical output will be directed towards the wearer's ear. Finally, as shown in FIG. 28, the coupling 142 is pinched closed to lock the detachable module 104 to the left earstem 112 of the support 102.

Figure 29:
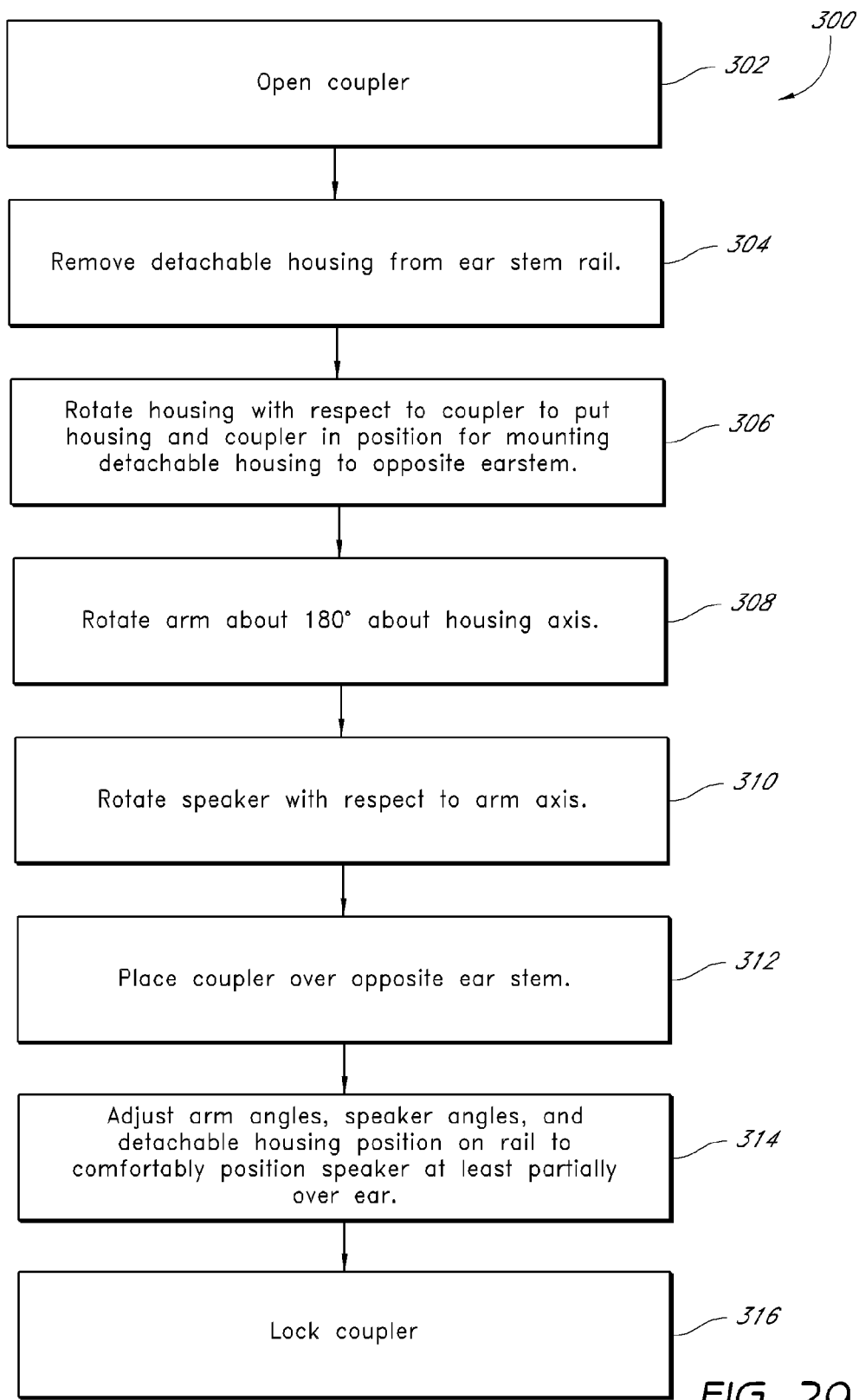
FIG. 29 is one embodiment of a method of moving a detachable module from one earstem of eyewear to the other.

One method 300 of moving a detachable module from one earstem to the other is shown in the flowchart of FIG. 29.

At block 302, the coupler of the detachable module is opened. At block 304, the detachable housing removed from the rail of the earstem. At block 306, the housing is rotated with respect to the coupler to put the housing and coupler in position for mounting the detachable housing to the opposite earstem. At block 308, the arm is rotated about 180 degrees about the housing axis. At block 310, the speaker is rotated with respect to the arm axis. At block 312, the coupler is placed over the opposite earstem. At block 314, the arm angles, speaker angles, and detachable housing position on the rail are adjusted to comfortably position the speaker at least partially over the ear. At block 316, the coupler is locked onto the opposite earstem rail.

Figure 30:
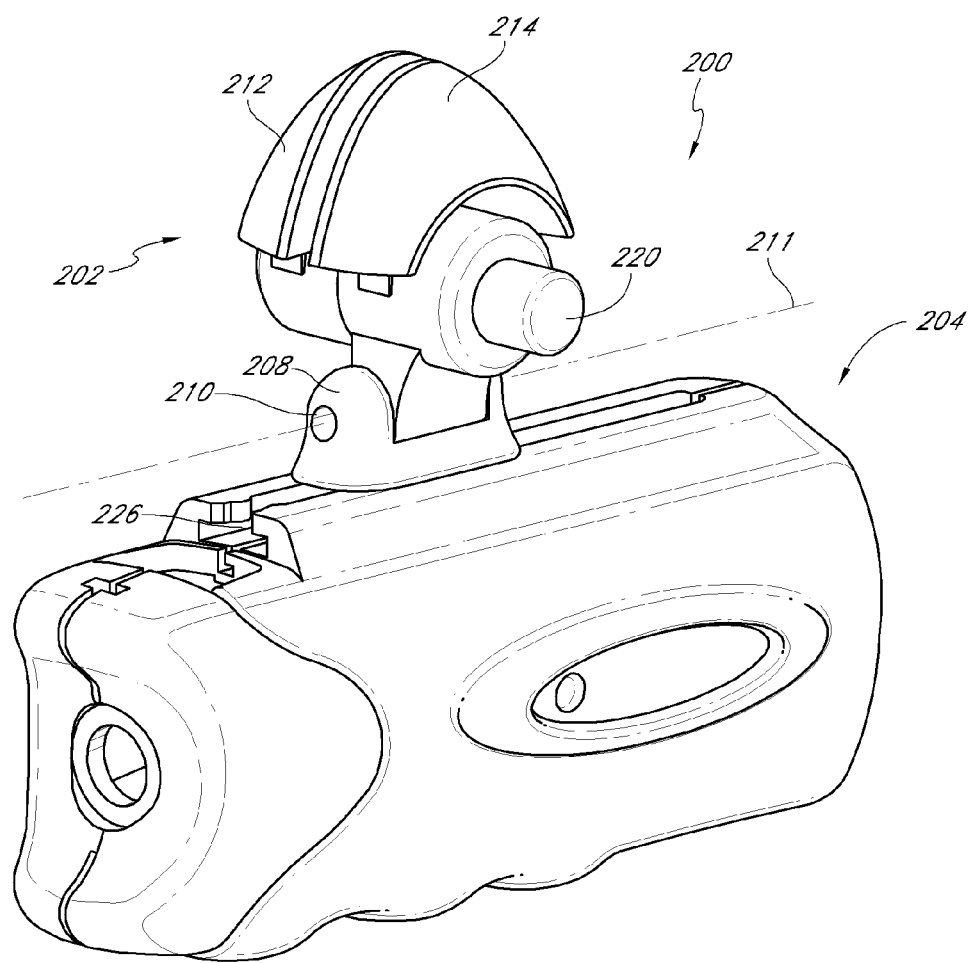
FIG. 30 shows a detachable module in accordance with another embodiment of the present invention.

Another embodiment of a detachable module 200 is illustrated in FIG. 30. The detachable module 200 includes a coupling 202 and a housing 204. The coupling 202 includes a clamp assembly 206 that is coupled to a slide 208 with a pin 210. The pin 210 has a longitudinal axis 211 about which the slide 208 may be rotated with respect to the clamp assembly 206. The detachable module 200 often also includes an articulating arm or a boom to which an audio input or output device is attached. For example, in some embodiments, the detachable module includes an articulating arm and a speaker, such as the articulating arm described below with respect to FIGS. 39A-41C.

Figure 31:
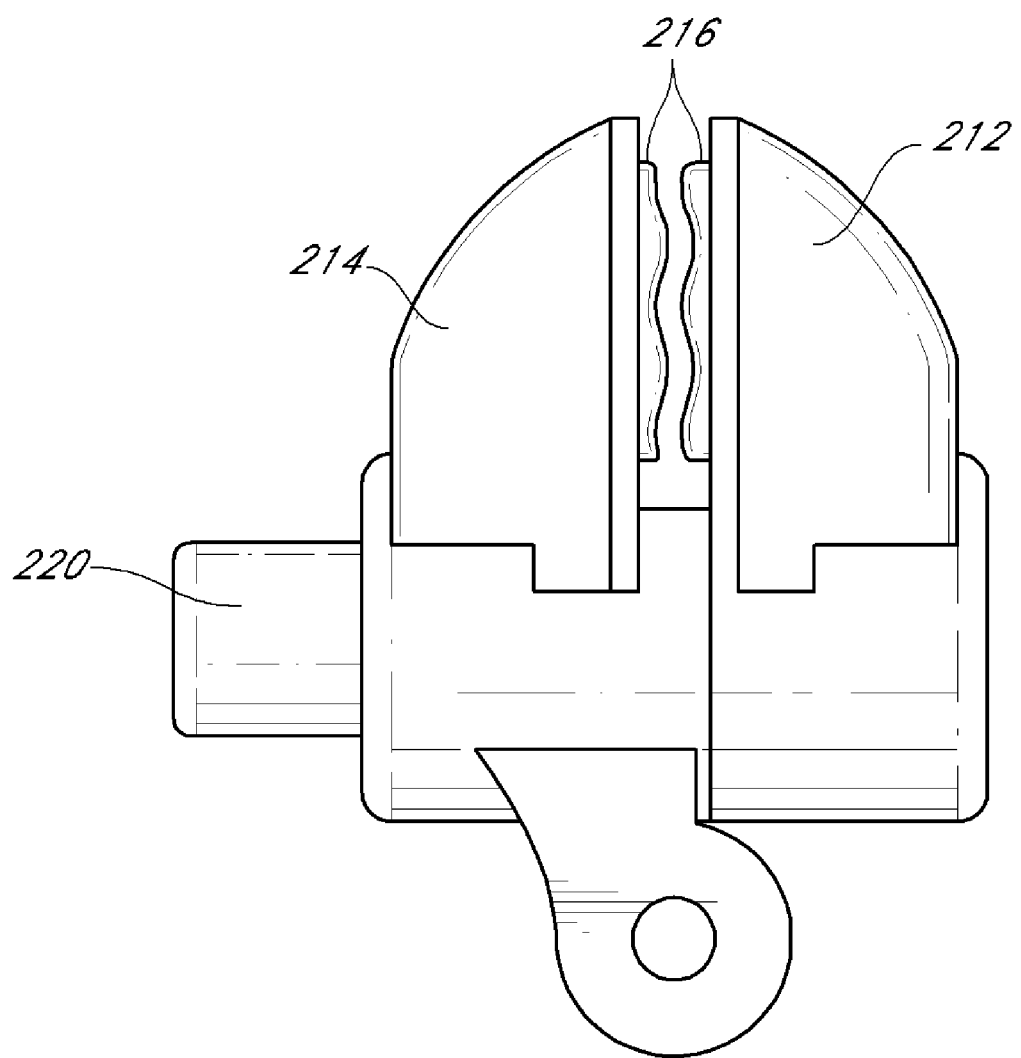
FIG. 31 is a side view of the clamp assembly of the detachable module of FIG. 30.

The clamp assembly 206 includes an inside grip 212, an outside grip 214, a resilient, conformable gripping pad 216 (such as best seen in FIG. 31), a spring 218, and a release 220. The release 220 can be any of a variety of structures to open the clamp assembly 206, including a button, lever, switch, tab, or knob. The clamp assembly 206 allows the detachable module 200 to be removably connected to any of a variety of structures, including the frame of a pair of eyeglasses. Many eyeglass frames have irregular, uneven, or non-uniform earstems, which makes it difficult to attach components to the eyeglasses. However, a universal clamp, such as the clamp assembly 206, allows the detachable module 200 to be removably connected to any of a variety of eyeglass frame structures, including those having irregular, uneven, and/or non-uniform earstems. Additional details regarding the coupling between the clamp assembly 206 of the detachable module 200 and an eyeglass frame are provided herein.

Figure 32:
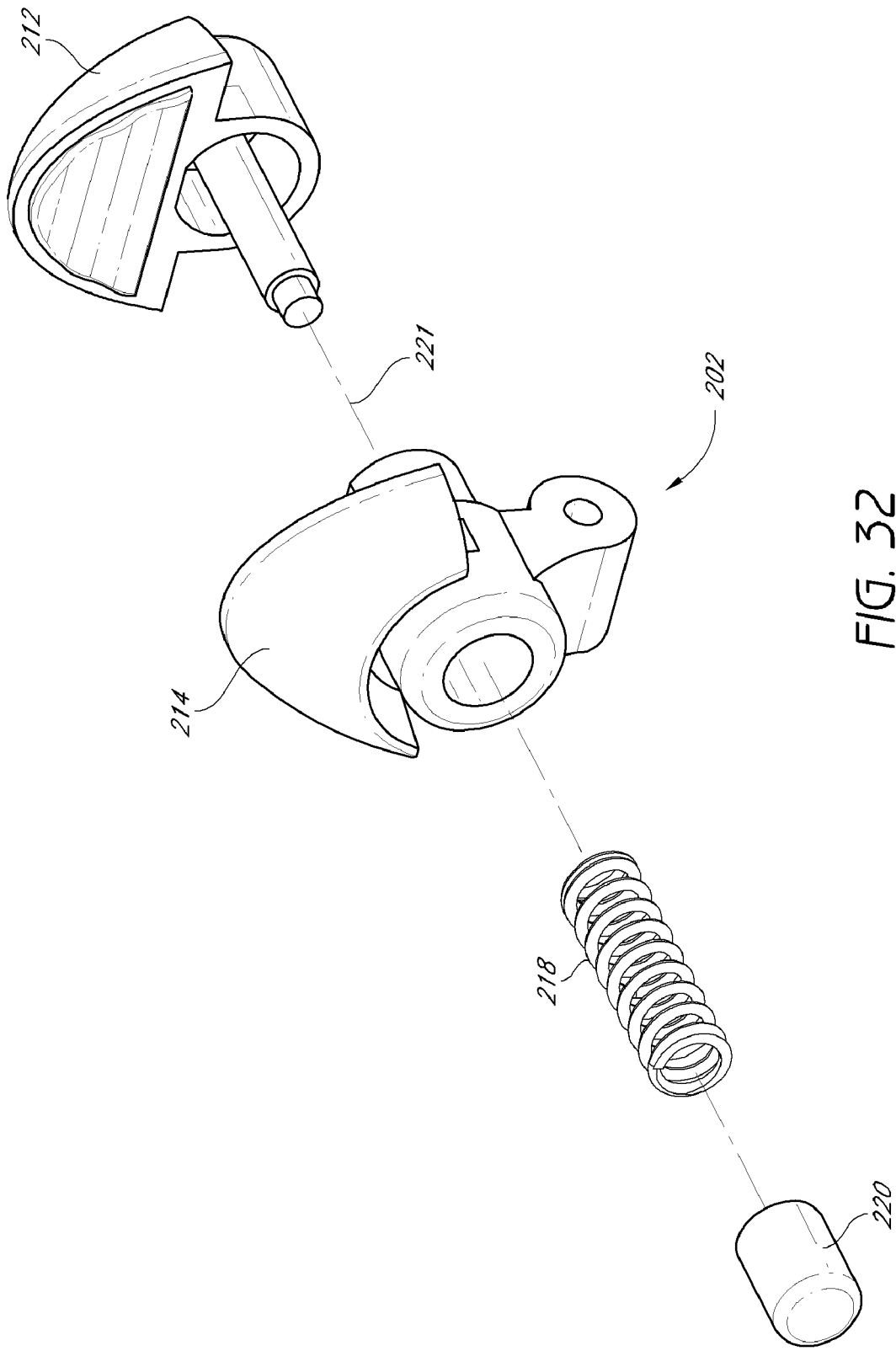
FIG. 32 is an exploded view of the clamp assembly of FIG. 31.

An exploded view of one embodiment of a clamp assembly 206 is illustrated in FIG. 32. The inside and outside grips 212, 214 of the clamp assembly 206 matingly engage each other over a clamp post 221. The clamp post 221 can include any of a variety of structures well known to those of skill in the art, including a Mattel pin. A spring 218 surrounds the clamp post 221. A release 220 is attached to the end of the clamp post 221 using any of a variety of methods, including pressing, gluing, welding, pinning, or screwing the release 220 to the clamp post 221. The release 220 prevents removal from the spring 218 from the clamp post 221 and allows the inside and outside grips 212, 214 to be separated apart from one another in order to release the detachable module 200 from the device to which it is attached, such as an eyeglass frame.

Figure 33A:
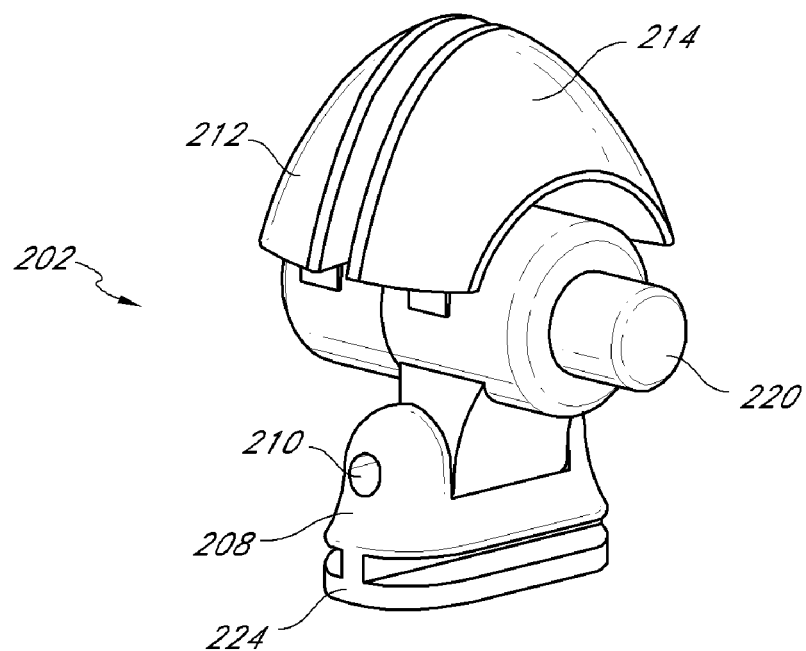
FIGS. 33A and 33B are perspective views of coupling assemblies including the clamp assembly of FIG. 31.
Figure 33B:
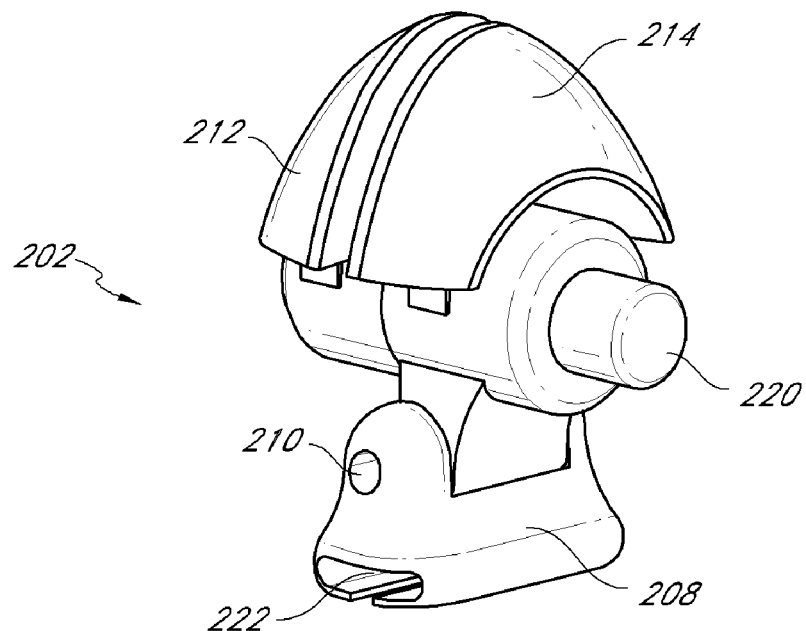
Figure 34A:
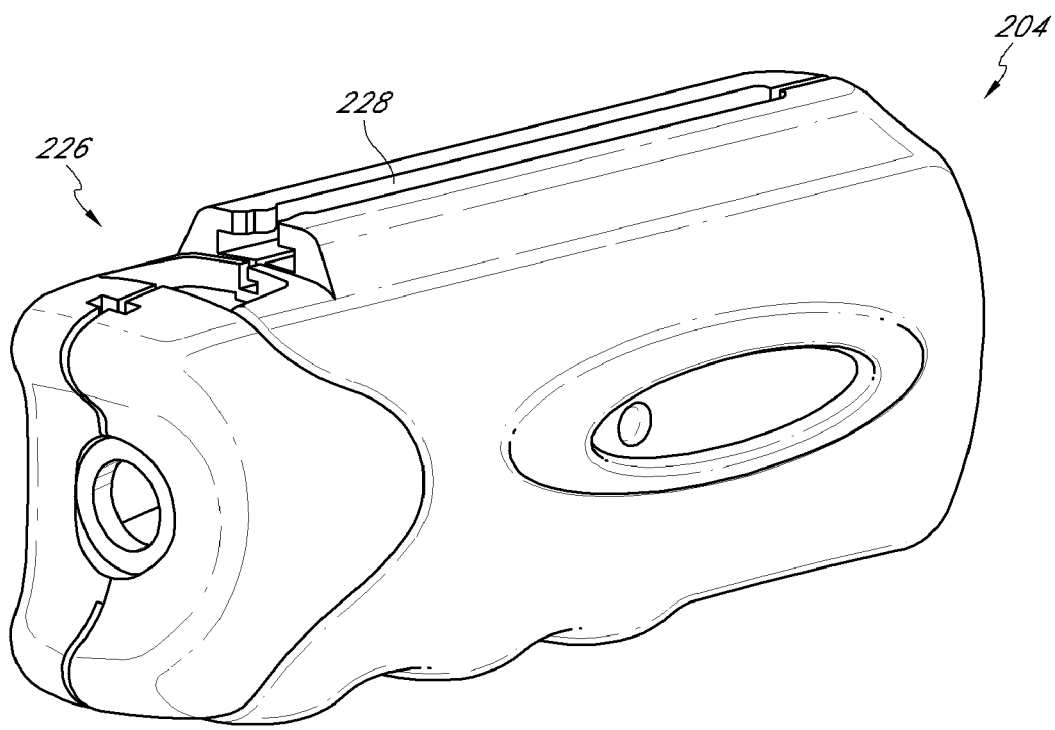
FIGS. 34A and 34B are perspective views of the housing of detachable modules suitable to be coupled with the coupling assemblies of FIGS. 33A and 33B, respectively.
Figure 34B:
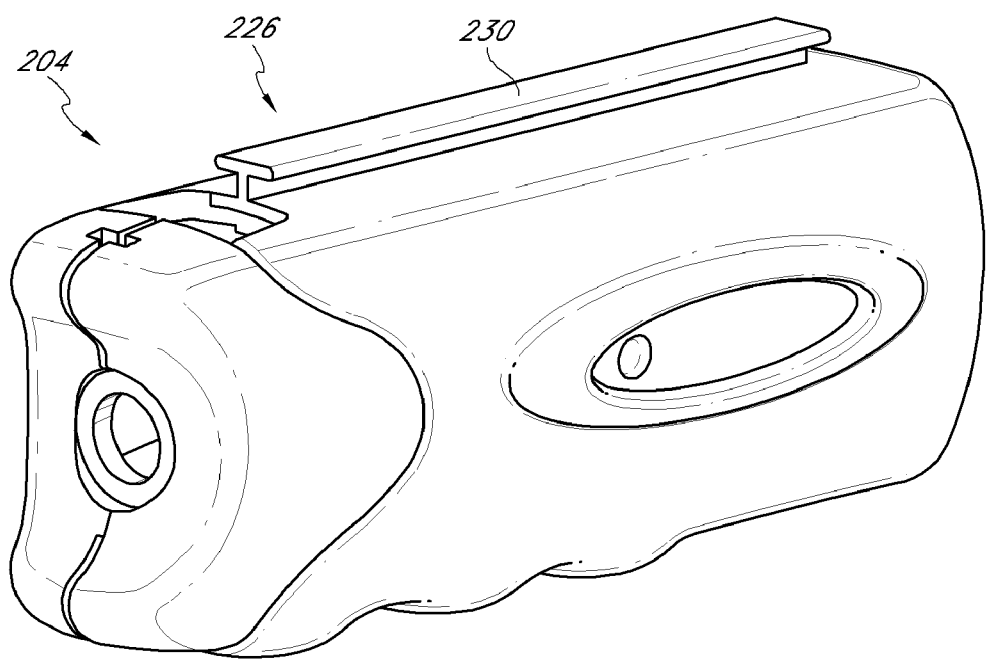

A coupling assembly 202 is formed by attaching the clamp assembly 206 to a slide 208, as illustrated in FIGS. 33A and 33B. The slide 208 can include a male member, such as a rail 222, or a female member, such as a track 224, as seen in FIGS. 33A and 33B, respectively. The slide 208 matingly engages a corresponding mating surface 226 on the housing 204 of the detachable module 200. For example, when a male slide 208, such as illustrated in FIG. 33A is selected, the mating surface 226 of the housing 204 can be a track 228, such as illustrated in FIG. 34A. Similarly, when a female slide 208 is selected, such as illustrated in FIG. 33B, the corresponding mating surface 226 of the housing 204 can be a rail 230, such as illustrated in FIG. 34B.

The detachable module 200 can be attached to a support 232 as illustrated in FIG. 35. The support 232 can be any of a variety of wearable items, including a pair of eyeglasses, a hat, belt, ski goggles, etc. The coupling 202 is released by pressing on the release 220, which causes the inside grip 212 and outside grip 214 to separate and move apart from one another. When the inside and outside grips 212, 214 are separated, the coupling 202 can be positioned over the earstem 234 of a support 232. By squeezing the inside and outside grips 212, 214 together, the detachable module 200 can be secured to the earstem 234 of the support 232 as illustrated in FIG. 47. The coupling 202 can be secured to the support 232 in any of a variety of locations as desired by the wearer.

The configuration of the gripping pad 216 can facilitate connectivity between the detachable module 200 and any of a variety of surfaces or shapes of the support earstem 234. For example, the gripping pad 216 can be made from any of a variety of elastomeric materials, including foams, plastics, or any compliant material that can conform to the shape of the earstem 234 when the coupling 202 is attached thereto. In addition, the gripping pad 216 can have any of a variety of surface shapes and textures, including a flat surface, a wavy surface, a rippled surface, a contoured surface, etc. Gripping pads 216 having a contoured surface are illustrated in FIG. 31. In addition, the thickness of the gripping pad 216 can be selected to facilitate connectivity between the coupling 202 and the support 232. In one embodiment, the gripping pad 216 thickness is in the range of about 0.5 mm to 2 mm, about 1 mm to 3 mm, or about 3 mm thick.

An overmold may be provided on the mating surface 226 of the housing 204 to provide additional friction between the housing 204 and slide 208. Additional friction may be desired to prevent accidental or undesired movement of the housing 204 with respect to the slide 208. In addition, the mating surface 226 of the housing 204 can include a detent which prevents the slide 208 of the coupling 202 from unintentionally sliding off of or detaching from the housing 204.

Figure 36A:
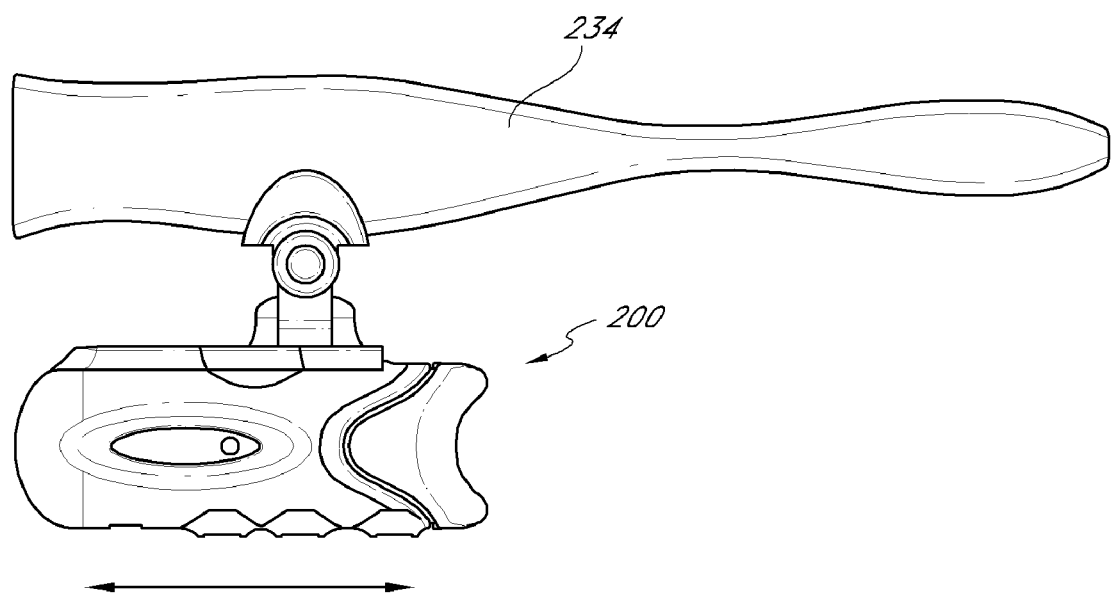
FIGS. 36A-37B are side views of the detachable module of FIG. 30 coupled to a support, showing an anterior-posterior range of motion and a vertical tilt range of motion.
Figure 36B:
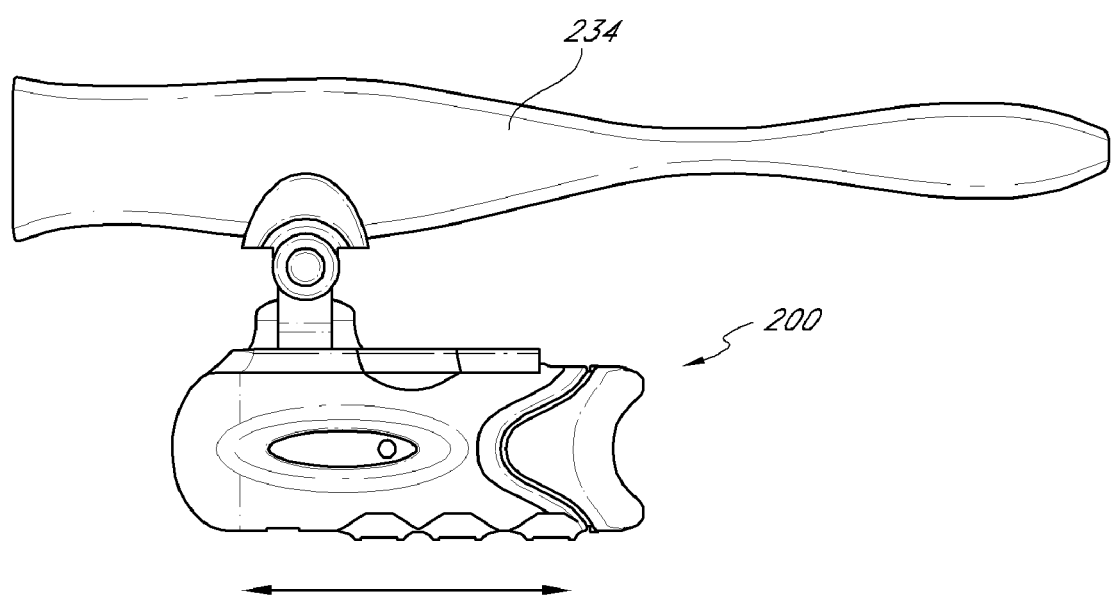

The coupling 202 of the detachable module 200 allows the detachable module 200 to be attached to any of a variety of locations on an eyewear on a support 232 frame. For example, in some embodiments, the support 232 includes a pair of eyeglasses having earstems 234 of a non-uniform shape. One example of such earstem 234 is illustrated in FIGS. 36A and 36B.

The detachable module 200 can be moved in anterior and posterior directions with respect to the earstem 234 once the detachable module 200 is attached to the earstem 234. FIG. 36A shows the detachable module 200 moved in an anterior direction and FIG. 36B shows the detachable module 200 moved in a posterior direction. The anterior-posterior travel distance over which the detachable module 200 can be moved with respect to the earstem 234 can be defined by the length of the mating surface 226 of the housing 204 and the length of the slide 208 of the coupling 202. The travel distance is at least about 0.25 inches, generally at least about 0.75 inches and often at least about 1 inch or 1.5 inches or more. This travel distance, or adjustment length, can be selected to provide adjustability of the detachable module 200, not only with respect to the earstem 234, but also with respect to the wearer's ear. An articulating arm, or speaker boom (not shown), is often attached to the detachable module 200 and can include any of a variety of speaker mounts such as though described above or below.

Figure 37A:
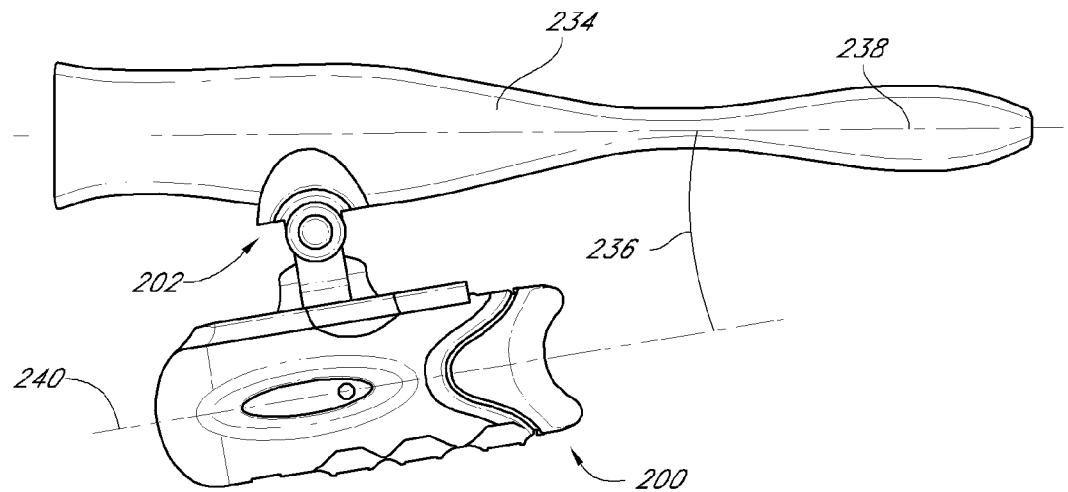
Figure 37B:
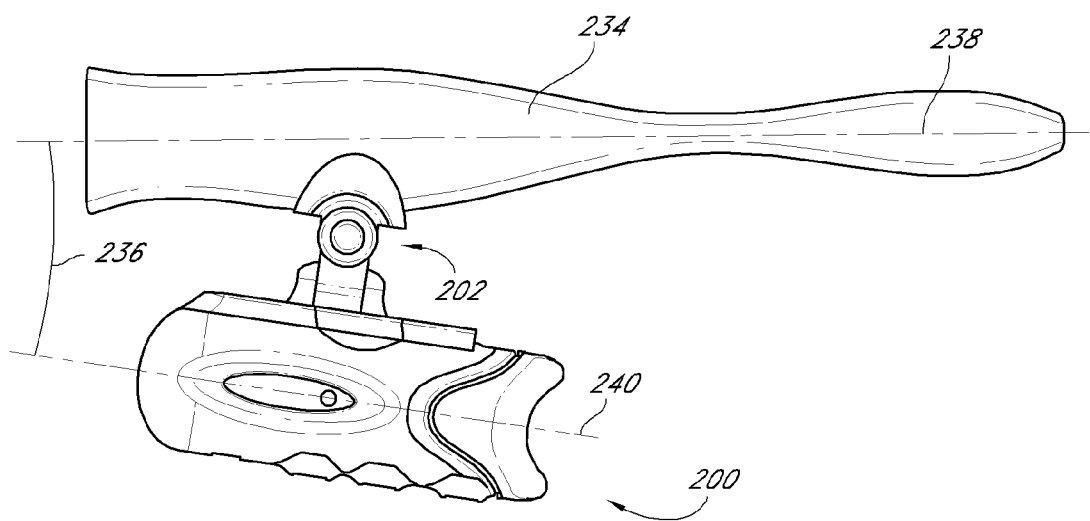

The angular orientation of the detachable module 200 with respect to the earstem 234 may be adjusted as well. For example, as illustrated in FIGS. 37A and 37B, the axial angle 236 formed between the earstem longitudinal axis 238 and the detachable module longitudinal axis 240 may be selected by adjusting the angular orientation of the coupling 202 with respect to the earstem 234 during attachment.

Figure 38A:
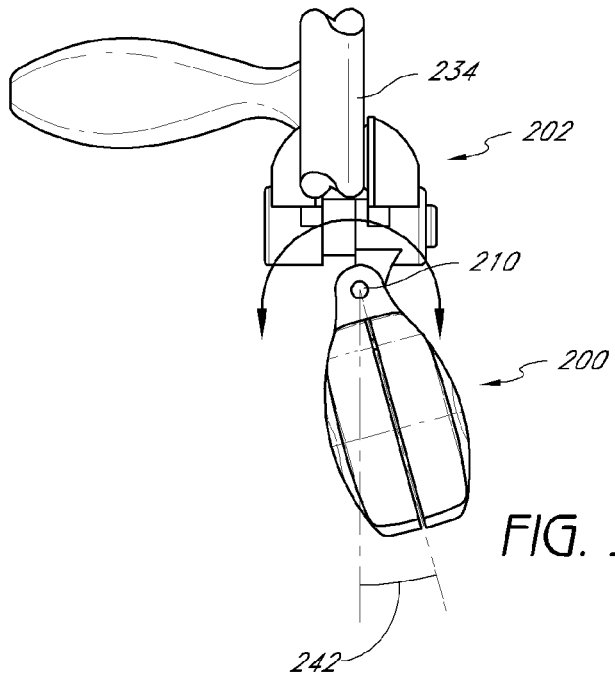
FIGS. 38A-38C are end views of the detachable module of FIG. 35 showing a lateral-medial direction tilt range of motion.
Figure 38B:
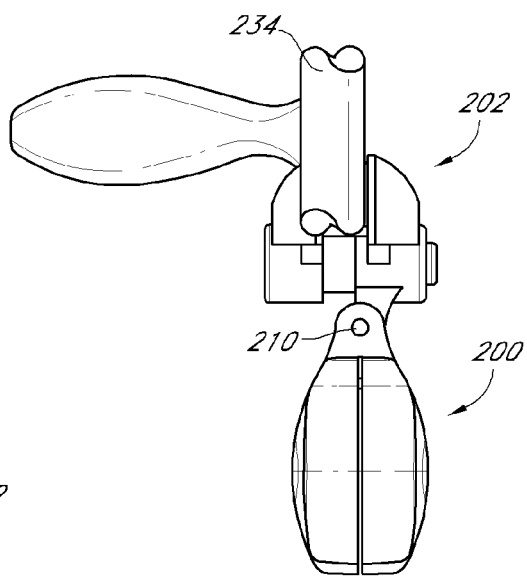
Figure 38C:
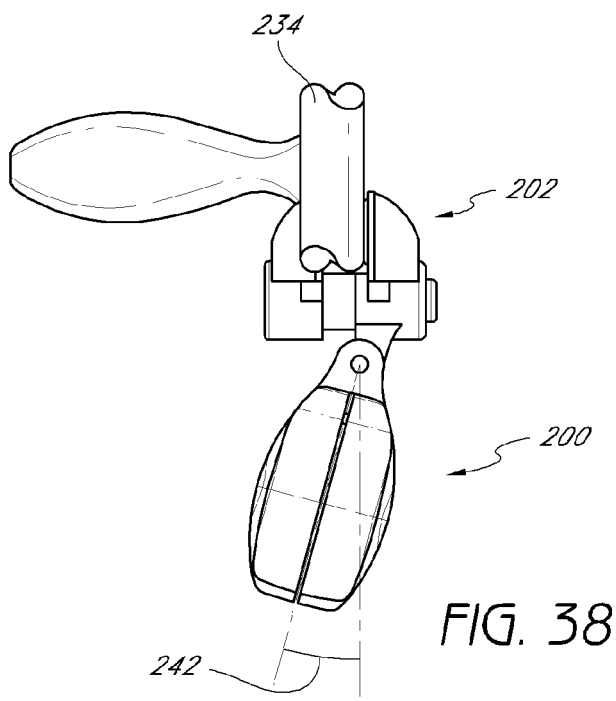

In addition, a tilt angle 242 in the medial-lateral direction can be selected by rotating the housing 204 of the detachable module 200 about an axis such as pin 210. The tilt angle 242, as illustrated in FIGS. 38A-38C, can be at least about plus ±5°, at least about ±10° to 20°, or greater.

Figure 39A:
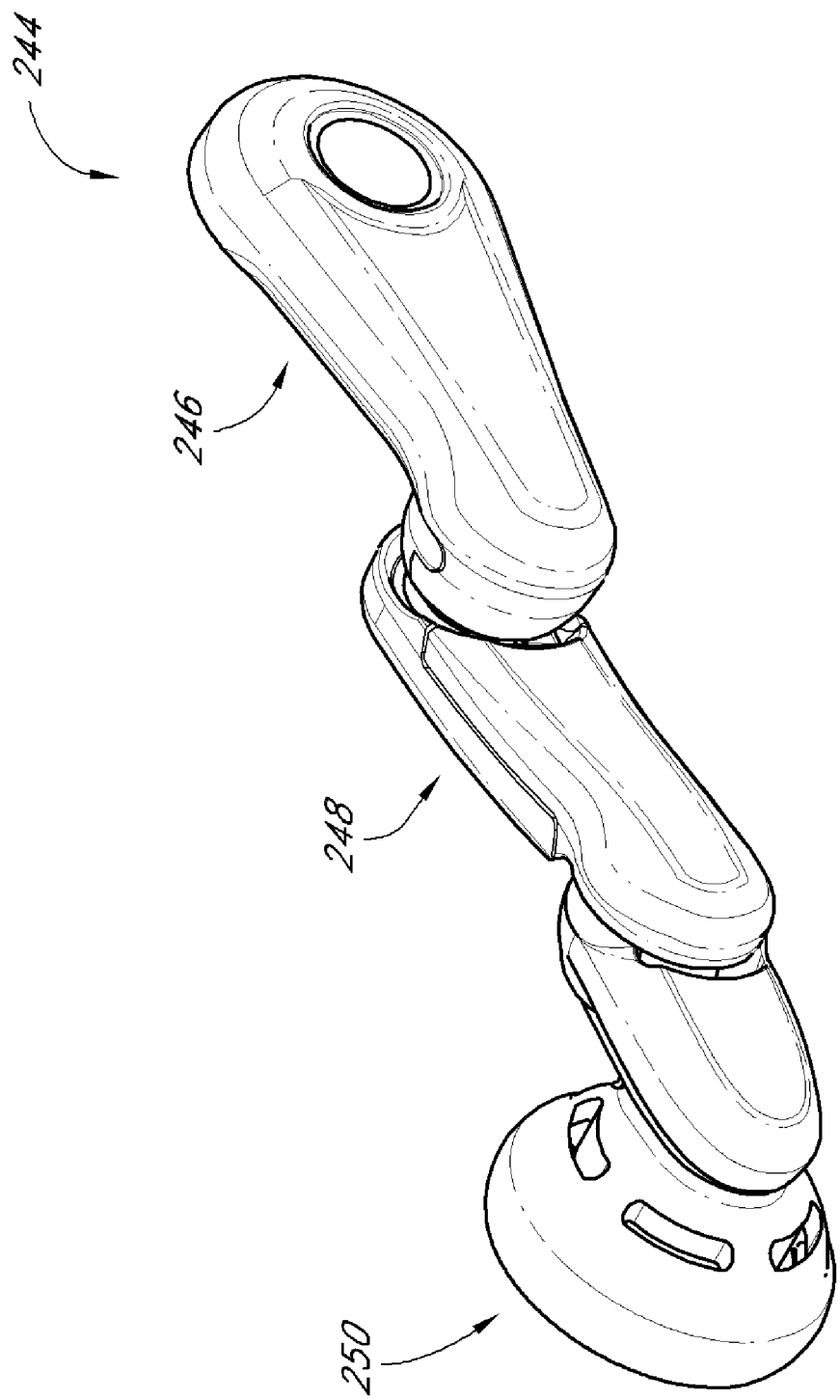
FIG. 39A is one embodiment of an articulating arm suitable to be connected to the detachable module of FIGS. 30-38C or directly to a pair of eyewear.
Figure 39B:
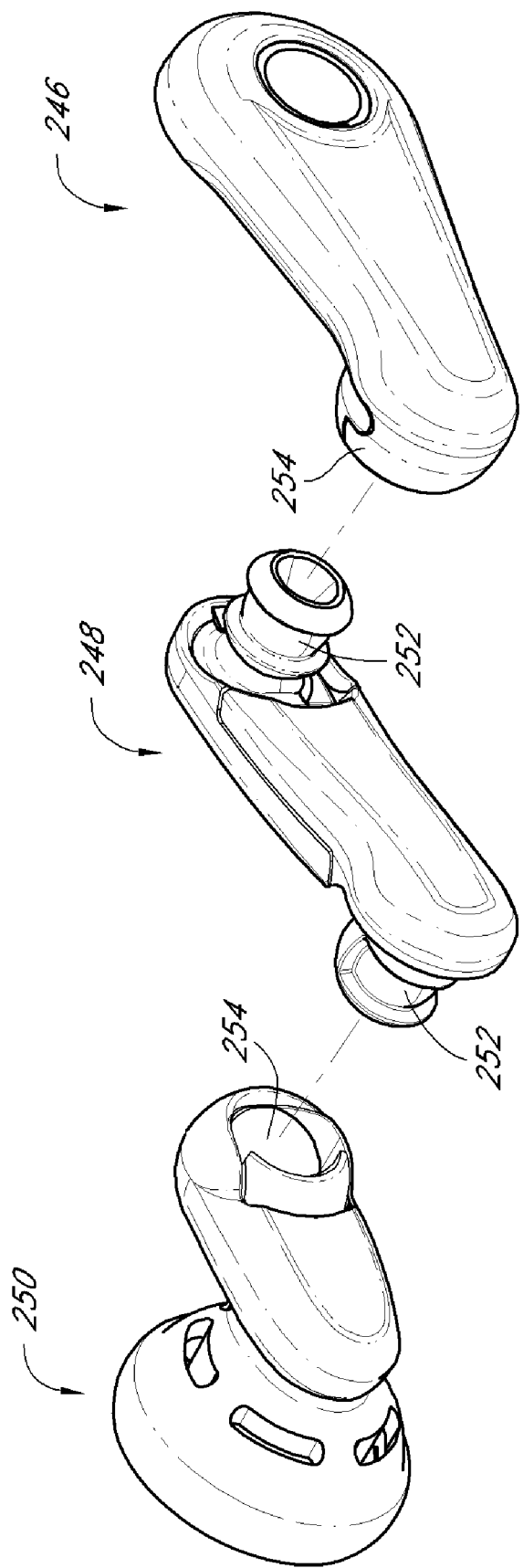
FIG. 39B is an exploded perspective view of the articulating arm of FIG. 39A.

In many embodiments, the detachable housing has an articulating arm 244 such as illustrated in FIGS. 39A and 39B. The articulating arm 244 provides an extension from the detachable housing onto which an electrical component, such as a speaker, may be mounted. For example, the articulating arm 244 can include a first segment 246, a second segment 248, and a third segment 250 that are connected to each other by any of a variety of couplings well known to those of skill in the art. For example, the coupling can be a ball 252 and socket 254 assembly, such as illustrated in FIG. 39B.

The first segment 246 is connected to a housing, such as any of the detachable housings described above, and the second segment 248. The second segment 248 is connected to the first and third segments 246, 250. The third segment 250 is connected at one end to the second segment 248 and at the other end to a speaker (not shown). A conductor or conductor pair (also not shown) extends from the speaker to the detachable housing.

Although the present embodiment describes an articulating arm 244 coupled to a detachable housing, it should be well understood by those of skill in the art that the articulating arm 244 may instead be attached directly to the earstem of a support, such as a pair of eyeglasses, a helmet, goggle straps or others. In such cases, electronic devices, such as MP3 players, cell phones, wireless transceivers, etc. can be embedded or mounted inside of the eyeglass frame instead of being carried by the detachable housing.

Figure 40:
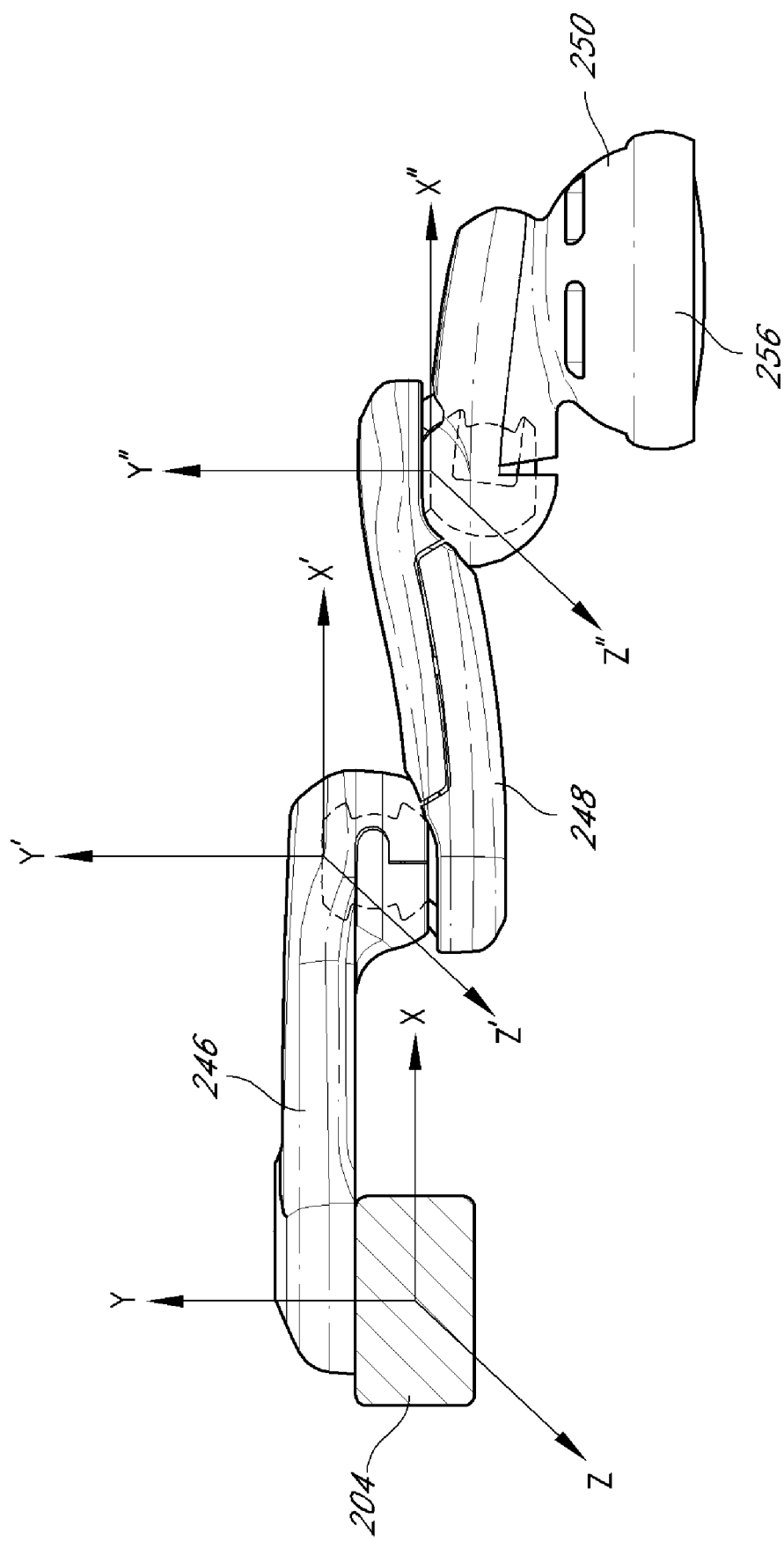
FIGS. 40-41C are side views of the articulating arm of FIG. 39A showing special adjustability of its multiple segments in a lateral-medial direction.

A side view of one embodiment of an articulating arm 244 is illustrated in FIG. 40. FIG. 40 illustrates one orientation of the various segments 246, 248, 250 of the articulating arm 244 with respect to the housing 204 of a detachable module 200. Although the articulating arm 244 is shown coupled to the housing 204 of a detachable module 200, the articulating arm 244 may alternatively be coupled directly to the earstem of a pair of eyeglasses, as discussed above.

Each of the first, second and third segments 246, 248, 250 have a longitudinal axis parallel to a reference axis x, x', x". Each of the reference axes x, x', x" defines one of three dimensions of a reference system for describing the orientation of the particular segment 246, 248, 250. In the illustrated embodiment, the x reference axis is parallel to the longitudinal axis of the first segment 246 and is also perpendicular to a z axis which can define the longitudinal axis of the housing 204 of the detachable module 200. A third axis y is perpendicular to both the x and z axes.

A second reference system includes an x' axis that is parallel to the longitudinal axis of the second segment 248 and which can be tangential to an outside surface of the second segment 248. Similarly, y' and z' reference axes are perpendicular to each other and the x' axis and are parallel to the y and y" axes when the x' axis is oriented parallel to the x axis.

In addition, an x" reference axis extends parallel to the longitudinal axis of the third segment 250 and is generally tangential to an exterior or an outside surface of the third segment 250. Similarly, y" and z" reference axes are perpendicular to each other and to the x" axis as well. Like the reference systems described above, the y" axis is parallel to both the y and y' axes when the x" axis is oriented such that it is parallel to both the x and x' axes. Similarly, the z" axis is parallel to both the z and z' axes when the x" axis is oriented parallel to both the x and x' axes. This linear orientation of the articulating arm 244 is illustrated in FIG. 40 where all three reference axes, x, x', x", are oriented parallel to each other.

The articulating arm 244 can be manipulated in a variety of planes and moved and rotated in a variety of manners to change the distance and angular orientation between the housing 204 of the detachable module 200 and a speaker attached to the third segment 250 of the articulating arm 244. For example, in one embodiment, the first segment 246 of the articulating arm 244 can rotate freely about the y axis in the xz plane and is limited in its movement only by contact with the housing 204 of the detachable module 200 or by contact with the support 232 (not shown). The first segment 246 can generally rotate about 340°, about 300° to 350°, or at least 325° about the y axis. The second segment 248 can rotate about the y' axis freely, also generally limited only by contact with the housing 204 of the detachable module 200 or by contact with the support. In addition, the second segment 248 can tilt with respect to the x'z' plane. For example, in one embodiment, the second segment 248 can tilt +15°/−0° with respect to the x'z' plane. In other embodiments, the second segment 248 can tilt at least about ±5°, or about ±10° with respect to the x'z' plane.

The third segment 250 can rotate about the y" axis and is generally limited by the design of the ball 252 and socket 254 joint between the second and third segments 248, 250. In one embodiment, the third segment 250 can rotate about ±85° about the y" axis. In addition, the third segment 250 can tilt with respect to the x'z' plane. For example, in one embodiment, the third segment 250 tilts about +0°/−15°, about ±5°, or about ±10° with respect to the x"z" plane.

Figure 41A:
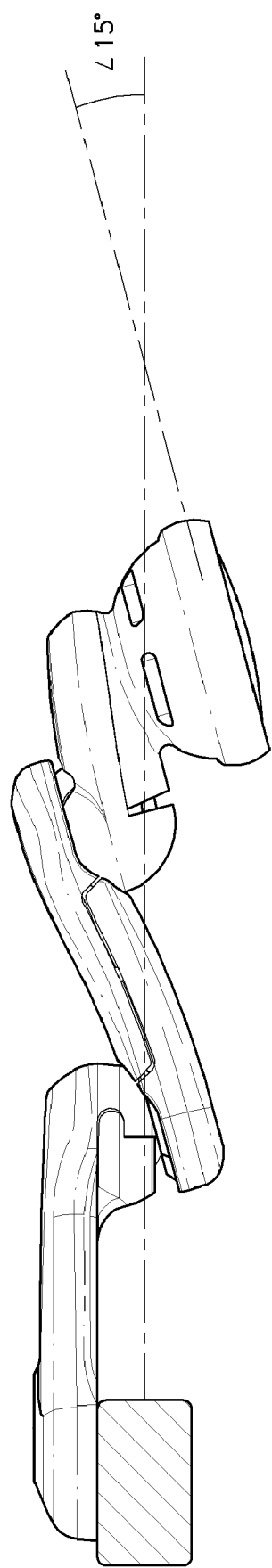
Figure 41B:
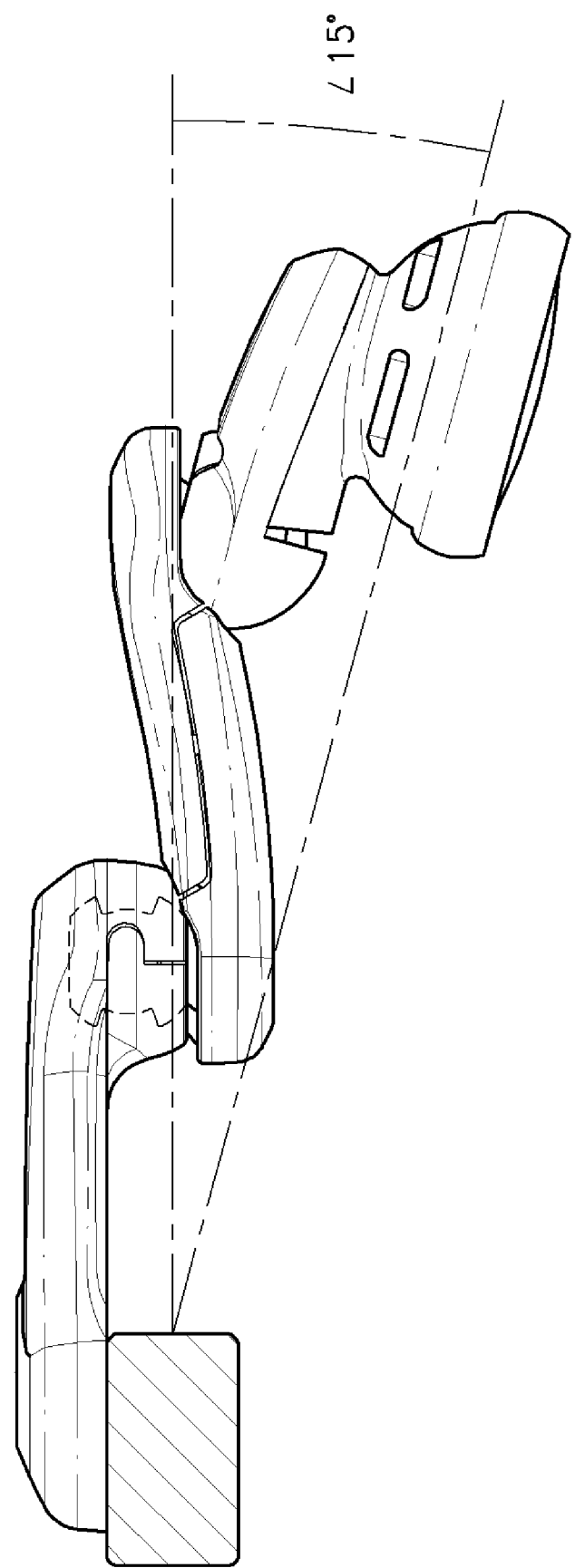
Figure 41C:
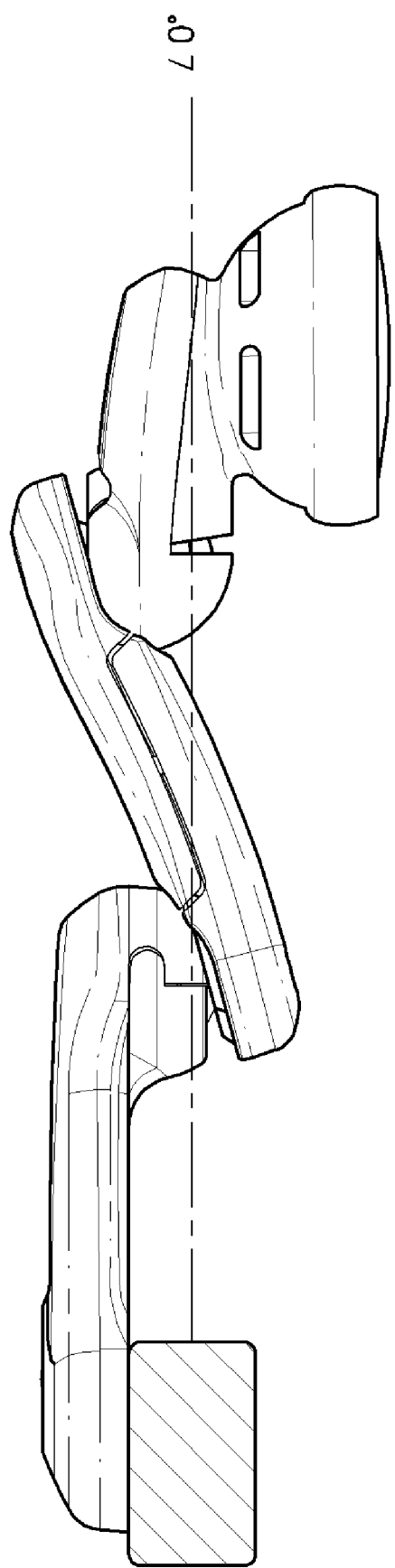

By selecting different angular orientations between the various segments, the angular orientation between the speaker 256 mounted on the third segment 250 of the articulating arm 244 with respect to the housing 204 of the detachable module 200 can be adjusted as well. Examples of such adjustments are illustrated in FIGS. 41A-41C. In FIG. 41A, the second segment 248 is tilted to an angle 151 which is its maximum positive angle with respect to the xz plane, and the third segment 250 is not tilted with respect to the x'z' plane. In such case, the tilt angle between the speaker 256 and the housing 204 is the same as the maximum positive tilt angle 153 of the second segment 248.

In FIG. 41B, the second segment 248 is not tilted, but the third segment 250 is tilted to an angle 153, which is the maximum negative angle with respect to the xz plane. In such case, the tilt angle 153 between the speaker 256 and the housing 204 is equal to the maximum negative tilt angle of the third segment 250.

Finally, in FIG. 41C, the second segment 248 is tilted to its maximum positive angle and the third segment 250 is tilted to its maximum negative angle with respect to the xz plane. In such case, the angle tilt will be equal to the difference between the max tilt angle of the second segment 248 and the maximum negative angle of the third segment 250. When the maximum positive tilt angle of the second segment 248 is equal to the maximum negative angle of the third segment 250, the speaker 256 will generally be oriented about parallel to the xz plane.

Figure 42:
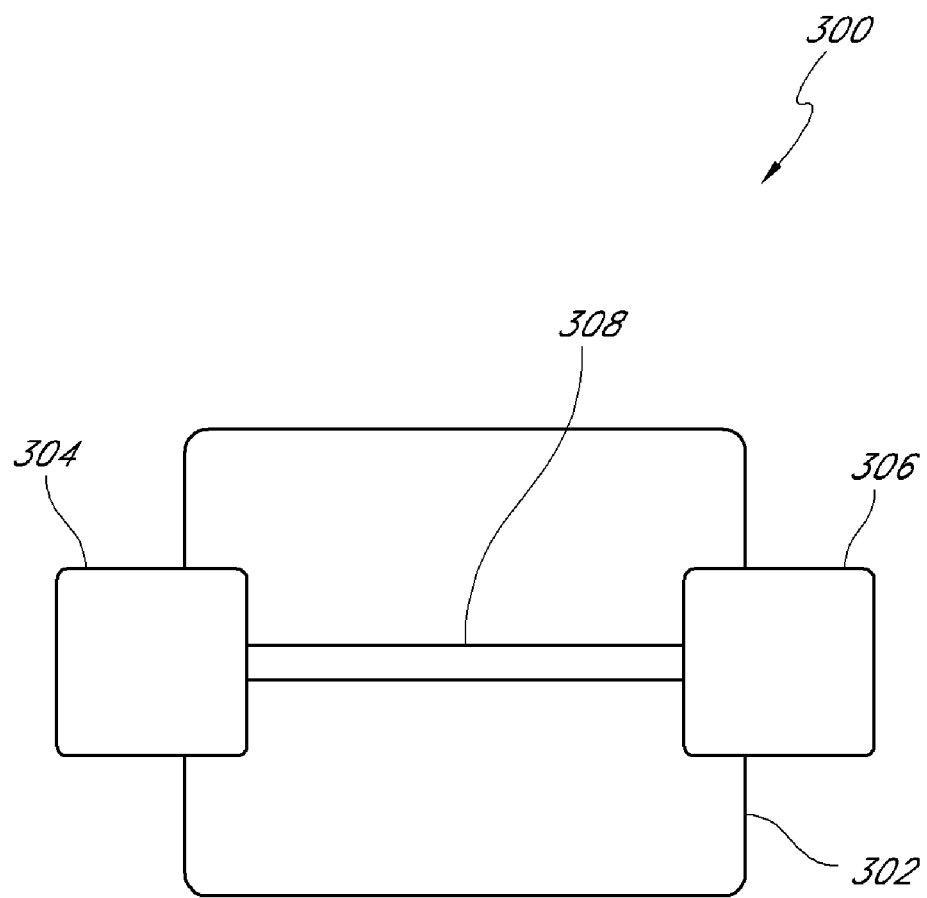
FIG. 42 is a schematic view of a support assembly in accordance with another embodiment of the present invention.

FIG. 42 shows a support assembly 300 in accordance with one embodiment of the present invention. The support assembly is generally any device able to be worn by a user that can carry one or more electronic components thereon. For example, the support assembly 300 can include an article of clothing, such as a hat, a shirt, a belt, jacket, helmet or a pair of eyewear such as goggles or eyeglasses.

The support assembly 300 generally includes a support 302, a first detachable module 304, and a second detachable module 306. The first and second detachable modules 304, 306 communicate with each other via a communication link 308. The detachable modules 304, 306 can be any of the detachable modules described herein. For example, the detachable modules 304, 306 can be a housing including electronics for an MP3 player, an audio storage device, a streaming audio signal receiver, a cellular telephone, a Bluetooth transceiver, or any other electrical device for providing audio or video input or output.

The support 302 is any structure able to be worn by the user such as, for example, a pair of eyeglasses. The communication link 308 is any wired or wireless link able to provide communication between two or more electrical components. For example, the communication link 308 can be a wired link, such as a flexible wire or a preformed wire, which may be permanently connected or unplugable at one or both of its ends. When the communication link 308 is a wire link, it may be unplugable at its ends so that it may be detached from each of the detachable modules 304, 306. The communication link 308 can be provided at any location with respect to the support 302. For example, the communication link 308 can include a wire or conductor located within and/or coupled to the support. For example, the communication link 308 can be a wire that hangs off the back of the support 302.

Figure 43:
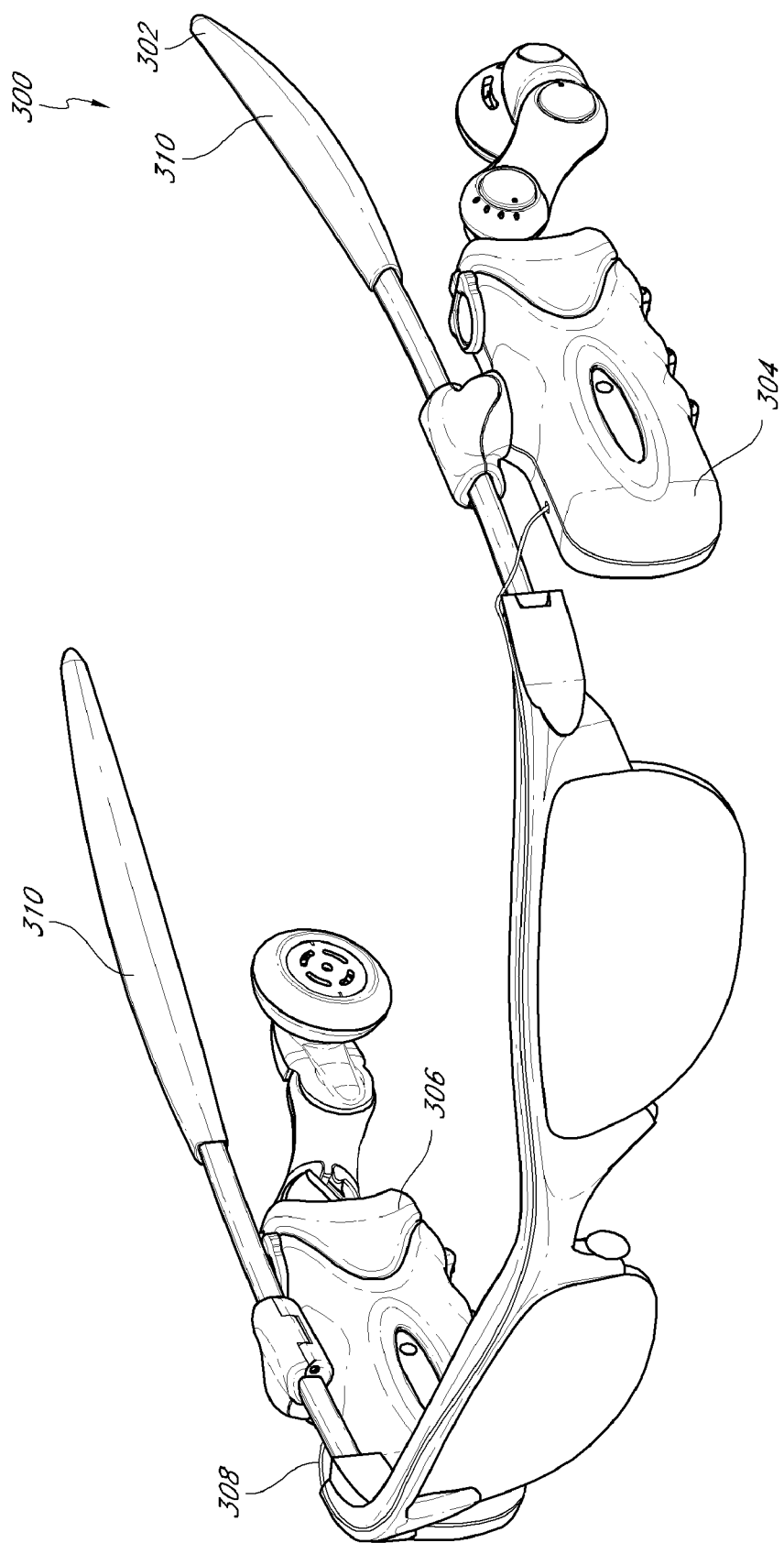
FIG. 43 is a perspective view of one specific embodiment of the support assembly of FIG. 42.

FIG. 43 illustrates one specific embodiment of the support assembly 300. In the illustrated embodiment, the support assembly 300 includes a pair of eyeglasses as the support 302. First and second detachable modules 304, 306 are attached to each of the first and second earstems 310, respectively, of the support 302. The detachable modules 304, 306 are coupled to each other with a wired communication link 308 that in the illustrated embodiment runs along the frame of the support 302. In one embodiment, the communication link 308 spans or traverses a nose bridge formed between the orbitals of the support 302.

The detachable modules 304, 306, as described herein, can include any of a variety of electrical components. In some embodiments, the detachable modules 304, 306 include different components. For example, in one embodiment, the first detachable module 304 carries a cellular telephone, and the second detachable module carries an MP3 player. Alternatively, the first detachable module 304 can include an RF (e.g., Bluetooth) transceiver adapted to communicate with another Bluetooth device, such as a Bluetooth-enabled telephone, and the second detachable module 306 can include an MP3 player or any other audio or video input or output device. In yet another embodiment, both the first and second detachable modules 304, 306 include Bluetooth transceivers and/or both include cellular telephones. It will be apparent to those of skill in the art that the support assembly 300 can therefore provide either dual mono or stereo audio for devices, such as telephones, that have historically provided only single-channel audio signals.

Although the support assemblies 300 are shown in FIG. 43 as having detachable modules 304, 306, in other embodiments, the electronic circuitry of the detachable modules 304, 306 is mounted inside of the support 302 itself. For example, in some embodiments, the electronic devices are mounted inside of the support 302 and the articulated arm described and an articulated arm that is coupled to a speaker is mounted to the support 302 as well. In other embodiments, the electronic components are mounted inside of the articulated arm itself and not inside the articulated arm. In other embodiments, the electronic components are provided inside of the arm and the arm is removably attached to the frame or is removably attached to the support 302. Finally, in yet other embodiments, such as the embodiment illustrated in FIG. 43, the electronic components are provided inside of removable modules 304, 306 which are removably attached to the support 302. In such cases, the detachable modules 304, 306 also include articulating arms, such as described herein. Examples of support assemblies having electronic circuitry mounted within the support itself are taught in U.S. application Ser. No. 10/993,217, filed Nov. 19, 2004 and U.S. application Ser. No. 11/022,367, filed Dec. 22, 2004, which are incorporated by reference herein.

The support assembly 300 can be configured such that the first and second detachable modules 304, 306 each individually communicate with a cellular telephone. For example, each of the first and second detachable modules 304, 306 can each include a Bluetooth transceiver adapted to communicate via the Bluetooth protocol with a cellular telephone, or with more than one cellular telephone. Alternatively, in other embodiments, the first detachable module 304 includes a wireless Bluetooth transceiver adapted to communicate with a cellular telephone, and the second detachable module 306 includes the mechanical and electrical components for supporting and positioning and powering a speaker that is in communication with the electronics of the first detachable module 304. In such case, communication from the cellular telephone is received by the first detachable module 304 and audio signals are provided to a user's first ear by a speaker coupled to the first detachable module 304 and audio signals from the cellular telephone are provided to the wearer's second ear via a speaker coupled to the second detachable module 306 that is in communication with the first detachable module 304.

The support assembly 300 of the present invention can include any of a variety of additional features for improving and enhancing usability by a wearer. For example, the support assembly 300 can include software that provides the wearer with oral popdown-type menus for navigating through the multitude of commands that may be available. For example, by providing voice control over system functionality, the user need not manipulate mechanical buttons, switches or controls on the support assembly 300 in order to select different support assembly communication, audio, video functions.

In addition, the support assembly 300 can include noise cancellation hardware and/or software to reduce or eliminate noise provided to the wearer of the support assembly 300 during use and communication. In addition, in some embodiments, the support assembly 300 includes a bone conduction microphone to transfer audio information from the wearer. These features are well known to those of skill in the art.

Although this invention has been disclosed in the context of a certain preferred embodiments, it will be understood by those skilled in the art that the present invention extends beyond the specifically disclosed embodiment to other alternative embodiments and/or uses of the invention and obvious modifications and equivalents thereof. In particular, while the present support assembly, support, detachable module and methods have been described in the context of a particularly preferred embodiment, the skilled artisan will appreciate, in view of the present disclosure, that certain advantages, features and aspects of the support assembly, support, detachable module and method may be realized in a variety of other devices. Additionally, it is contemplated that various aspects and features of the invention described can be practiced separately, combined together, or substituted for one another, and that a variety of combination and sub-combinations of the features and aspects can be made and still fall within the scope of the invention. Thus, it is intended that the scope of the present invention herein disclosed should not be limited by the particular disclosed embodiment described above, but should be determined only by a fair reading of the claims that follow.

What is claimed is:

1. A dual speaker support assembly, comprising:
a wearable support configured to support first and second speakers near a wearer's right and left ears;
a first speaker supported by the wearable support and configured to be positioned near the wearer's right ear when worn;
a second speaker supported by the wearable support and configured to be positioned near the wearer's left ear when worn; and
an electronics module supported by the wearable support and in electrical communication with each of the first and second speakers,
wherein the first speaker, second speaker, and electronics module are configured to be removably attached to the wearable support.

2. A dual speaker support assembly as in claim 1, wherein the electronics module includes an MP3 format memory.

3. A dual speaker support assembly as in claim 1, wherein the electronics module includes a radio frequency receiver.

4. A dual speaker support assembly as in claim 1, wherein the electronics module includes a radio frequency transmitter.

5. A dual speaker support assembly as in claim 1, wherein the electronics module includes a cellular telephone.

6. A dual speaker support assembly as in claim 1, wherein the first speaker is adjustable relative to the wearable support.

7. A dual speaker support assembly as in claim 1, further comprising an articulating arm that couples the first speaker to the electronics module.

8. A dual speaker support assembly as in claim 1, wherein the wearable support comprises an article of clothing.

9. A dual speaker support assembly as in claim 1, wherein the electronics module is configured to be rotated with respect to the wearable support while attached to the wearable support.

10. A dual speaker support assembly as in claim 1, wherein the electronics module further comprises a clamp.

11. A kit for electronically enabling a wearable support, comprising:
- a first speaker assembly comprising a first speaker and a first coupling, the first coupling configured to removably attach to the wearable support;
- a second speaker assembly comprising a second speaker and a second coupling, the second coupling configured to removably attach to the wearable support;
- source electronics supported by the first speaker assembly; and
- a communications link in communication with the first and second speakers and the source electronics.

12. A kit for electronically enabling a wearable support as in claim 11, wherein said source electronics comprises a digital music player.

13. A kit for electronically enabling a wearable support as in claim 11, wherein said source electronics comprises a radio frequency transmitter.

14. A kit for electronically enabling a wearable support as in claim 11, wherein said source electronics comprises a radio frequency receiver.

15. A kit for electronically enabling a wearable support as in claim 11, wherein said source electronics comprises a cellular telephone.

16. A kit for electronically enabling a wearable support as in claim 11, wherein said wearable support comprises an article of clothing.

17. A kit for electronically enabling a wearable support as in claim 11, wherein the source electronics are configured to be rotated with respect to the wearable support while attached to the wearable support.

18. A kit for electronically enabling a wearable support as in claim 11, wherein the communication link comprises wiring.

19. A kit for electronically enabling a wearable support as in claim 11, wherein the first coupling comprises a clamp.

20. A kit for electronically enabling a wearable support as in claim 11, wherein the first speaker assembly further comprises a housing and an articulating arm, wherein the articulating arm couples the first speaker to the housing.

* * * * *